(12) United States Patent
Sasaki et al.

(10) Patent No.: US 10,177,259 B2
(45) Date of Patent: Jan. 8, 2019

(54) SOLAR CELL MODULE AND METHOD FOR PRODUCING SOLAR CELL MODULE

(71) Applicant: KANEKA CORPORATION, Osaka-shi, Osaka (JP)

(72) Inventors: Toshiaki Sasaki, Otsu (JP); Toshinobu Nakata, Toyooka (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 216 days.

(21) Appl. No.: 14/898,840

(22) PCT Filed: Jun. 13, 2014

(86) PCT No.: PCT/JP2014/065731
§ 371 (c)(1),
(2) Date: Dec. 16, 2015

(87) PCT Pub. No.: WO2014/203817
PCT Pub. Date: Dec. 24, 2014

(65) Prior Publication Data
US 2016/0133761 A1 May 12, 2016

(30) Foreign Application Priority Data

Jun. 17, 2013 (JP) ................................ 2013-127062

(51) Int. Cl.
*H01L 31/18* (2006.01)
*H01L 31/046* (2014.01)
(Continued)

(52) U.S. Cl.
CPC .. *H01L 31/02168* (2013.01); *H01L 31/02366* (2013.01); *H01L 31/046* (2014.12);
(Continued)

(58) Field of Classification Search
CPC ......... H01L 31/02366; H01L 31/02168; C03C 19/00; C03C 17/00–17/44; C03C 2204/08
See application file for complete search history.

(56) References Cited

U.S. PATENT DOCUMENTS 6,538,195 B1 * 3/2003 Shi ....................... C03C 17/3636
136/256
2002/0129850 A1 * 9/2002 Nomura .............. H01L 31/0236
136/251
(Continued)

FOREIGN PATENT DOCUMENTS

JP    H08211202 A    8/1996
JP    H1070294 A     3/1998
(Continued)

OTHER PUBLICATIONS

ISA Japanese Patent Office, International Search Report Issued in Application No. PCT/JP2014/065731, dated Jul. 8, 2014, WIPO, 4 pages.
(Continued)

*Primary Examiner* — Eric R Smith
(74) *Attorney, Agent, or Firm* — Alleman Hall Crasman & Tuttle LLP

(57) ABSTRACT

Provided is a solar cell module which has a high anti-glare property and is capable of maintaining power output at a high level. In a solar cell module with a light-incident surface formed by laminating an antireflection film on a plate body made of glass, and a surface of the plate body is roughened. A substance for forming the antireflection film is introduced into a space formed in a crack situated slightly inside from the roughened surface. Formation of a layer of air in the crack is prevented to suppress reflection of light at a portion in which the crack is formed.

7 Claims, 35 Drawing Sheets

(51) Int. Cl.
H01L 31/048 (2014.01)
H01L 31/0216 (2014.01)
H01L 31/0236 (2006.01)

(52) U.S. Cl.
CPC ............ H01L 31/048 (2013.01); H01L 31/18 (2013.01); H01L 31/186 (2013.01); *C03C 2204/08* (2013.01); *Y02E 10/50* (2013.01)

(56) References Cited

U.S. PATENT DOCUMENTS

| | | | |
|---|---|---|---|
| 2006/0102891 A1* | 5/2006 | Brabec | H01L 31/0236 257/40 |
| 2008/0007852 A1* | 1/2008 | Kawasaki | B82Y 20/00 359/884 |
| 2011/0180134 A1* | 7/2011 | Kim | H01L 31/022425 136/256 |
| 2012/0003779 A1 | 1/2012 | Young | |
| 2012/0240999 A1* | 9/2012 | Yoshida | B82Y 10/00 136/256 |
| 2014/0246084 A1* | 9/2014 | Okahata | C03C 15/00 136/256 |

FOREIGN PATENT DOCUMENTS

| | | |
|---|---|---|
| JP | 2001057438 A | 2/2001 |
| JP | 2003229584 A | 8/2003 |
| JP | 2009088503 A | 4/2009 |
| JP | 2009143775 A | 7/2009 |
| JP | 2010070445 A | 4/2010 |
| JP | 2012009600 A | 1/2012 |
| JP | 2013040091 A | 2/2013 |
| WO | WO-2012141311 A1 * 10/2012 ............ C03C 15/00 |
| WO | 2012162446 A1 | 11/2012 |

OTHER PUBLICATIONS

International Bureau of WIPO, International Preliminary Report on Patentability Issued in Application No. PCT/JP2014/065731, dated Dec. 30, 2015, WIPO, 6 pages.

European Patent Office, Supplementary European Search Report Issued in Application No. 14813121, Search Completed Dec. 13, 2016, Berlin, Germany, 2 pages.

* cited by examiner

FIG. 2A
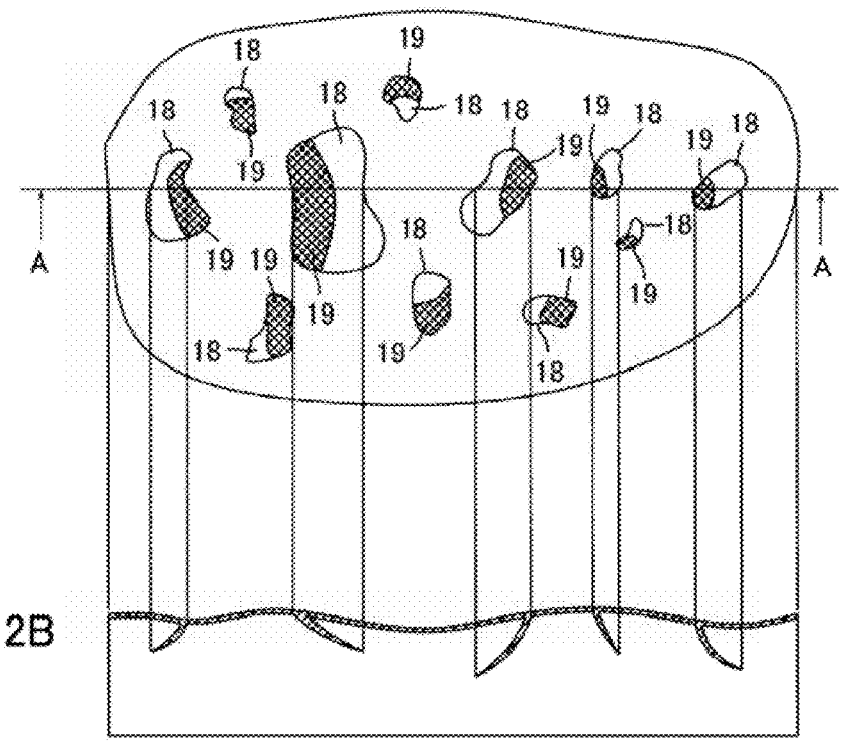
FIG. 2B
FIG. 2C
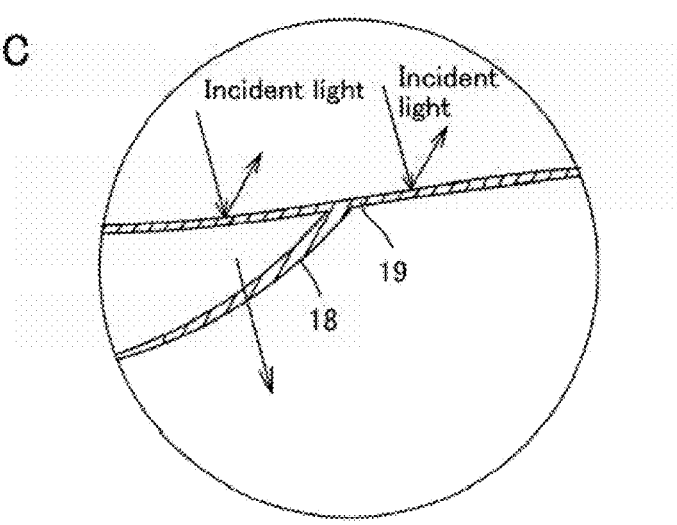

FIG. 19A

— Surface treatment in conventional technology —

[Sand is scattered in the state of lying down]

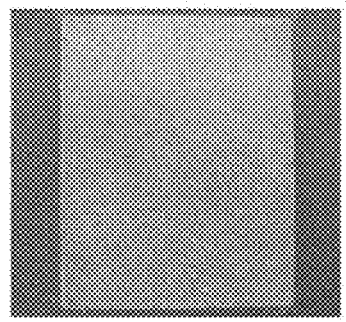

[Inclined state]

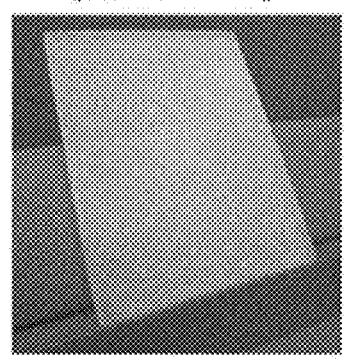

— Surface treatment according to Example 2 —

[Sand is scattered in the state of lying down]

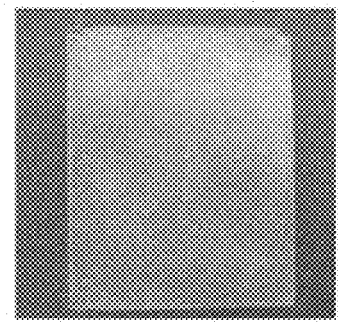

[Inclined state]

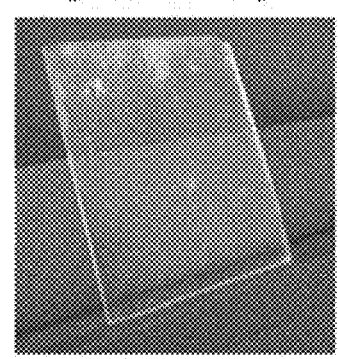

FIG. 19B

[State of depositing stains]

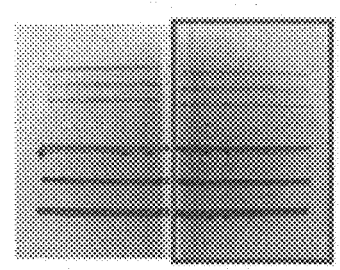

Surface treatment in conventional technology | Surface treatment according to Example 2

[After performing water-wiping five times]

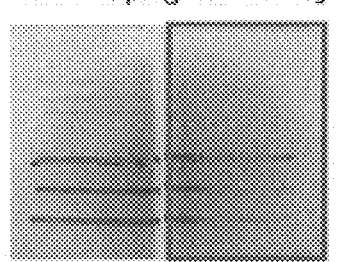

Surface treatment in conventional technology | Surface treatment according to Example 2

SOLAR CELL MODULE AND METHOD FOR PRODUCING SOLAR CELL MODULE

TECHNICAL FIELD

The present invention relates to a solar cell module, and more particularly to a solar cell module having an anti-glare property.

The present invention also relates to a method for producing a solar cell module having an anti-glare property.

BACKGROUND ART

In recent years, solar photovoltaic power generation systems that generate power by means of solar energy have rapidly spread. Such solar photovoltaic power generation systems include a system referred to as the roof installation type in which solar cell modules are installed on the top of a building, and a system referred to as the wall surface installation type in which solar cell modules are installed on a wall surface or a window of a building. Further, there is a system referred to as a ground installation type in which solar cell modules are installed on the ground outdoors.

In these types of solar photovoltaic power generation systems, there may be a problem caused by reflected light from the solar cell module depending on a position or angle at which the solar cell module is installed. For example, there is a problem that when a solar cell module is installed on the roof of a general house, reflected light passes through the window of the neighboring house. That is, there is a problem that sunlight is regularly reflected at the glass surface of a solar photovoltaic power generation module, so that unintended intense light passes into the neighboring house to give an unpleasant feeling to neighborhood residents.

Thus, the development of a solar cell module having a high anti-glare property is desired. That is, the development of a solar cell module with reduced regular reflection from a glass surface when sunlight shines thereon is desired.

A solar cell module having an anti-glare property is disclosed in Patent Document 1. The solar cell module disclosed in Patent Document 1 has an antireflection film provided on the surface of a glass substrate.

Here, the antireflection film is a film which has an optical refractive index between the refractive index of air and the refractive index of glass, and in the solar cell module disclosed in Patent Document 1, reflection of light is suppressed by reducing a difference in refractive index at each interface (air/antireflection film and antireflection film/glass) at which light is incident.

Patent Document 2 discloses a technology in which the surface of an antireflection film is roughened for the purpose of irregularly reflecting sunlight at the surface of a solar cell module.

According to the technology disclosed in Patent Document 2, an anti-glare property is enhanced due to the change in refractive index of the antireflection film, and in addition, light can be irregularly reflected due to the physically irregular structure on the surface, so that higher anti-glare performance is exhibited.

However, for employing the technology disclosed in Patent Document 2, it is necessary to form a considerably thick antireflection film, leading to the problem that the light absorption of the anti-glare film itself increases to deteriorate power generation efficiency.

An invention for solving these problems is disclosed in Patent Document 3.

In the invention disclosed in Patent Document 3, the surface of a glass substrate is subjected to blast processing to roughen the surface, and further, an antireflection film is provided thereon.

PRIOR ART DOCUMENT

Patent Document

Patent Document 1: JP 8-211202 A
Patent Document 2: JP 2001-57438 A
Patent Document 3: JP 2012-9600 A

DISCLOSURE OF INVENTION

Technical Problem

The solar cell module described in Patent Document 3 is one developed by the present applicant, and has a high anti-glare property and high power generation efficiency. However, as a result of conducting studies by persons including the present inventors, it has been found that the technology disclosed in Patent Document 3 has a disadvantage which is absent in the technology in Patent Document 2.

Specifically, in the solar cell module disclosed in Patent Document 3, the glass substrate is subjected to blast processing to roughen the surface thereof.

Here, blast processing is a surface treatment process in which fine abrasive particles are collided against a work piece to polish the surface thereof, and in blast processing, the surface of the glass substrate is struck. Consequently, fine cracks are generated in the glass substrate.

That is, in the technology disclosed in Patent Document 3, blasting abrasive materials are collided against a glass substrate having a smooth surface as shown in FIG. 34A, so that the surface is roughened as shown in FIG. 34B. At this time, the impact of the collision causes generation of fine cracks 104 as shown in FIG. 34C.

That is, an insufficiently impacted portion comes into a cracked state with undivided portions 105 generated as shown in FIG. 34C. Cracks 104 include those with a fissure developing in the depth direction of the glass substrate, and those with a fissure developing in a direction parallel to the glass substrate. A crack 104 with a fissure developing in a direction parallel to the glass substrate has a structure in which a fragment sticks in a scale-like form to a main body part of the glass substrate.

When such a crack 104 is formed, light is reflected between the inner surface of the crack 104 and the glass as shown in FIG. 35C. Particularly, the crack 104 with a fissure developing in a direction parallel to the glass substrate reflects light over a large area.

That is, when the cracks 104 are observed from the glass substrate side, the antireflection film is situated on the surface side, and the glass substrate is situated on the inside of the antireflection film as shown in FIG. 35A. The cracks 104 exist on the surface of the glass substrate. The cracks 104 include those with a fissure developing in the depth direction of the glass, and those with a fissure developing in a direction parallel to the glass substrate as shown in FIG. 35B. When light impinges on the portion of the crack 104 with a fissure developing in a direction parallel to the glass substrate, light is reflected between the inner surface of the crack 104 and the glass as shown in FIG. 35B. That is, in a portion having the crack 104, light is reflected not only at the outermost, but also at two locations; the interface between glass and air in the crack and the interface between air and glass, leading to an increase in reflection. As a result, the portion of the crack 104 appears to be shining white as shown in FIG. 36.

Such a crack itself is very small, but is not preferable because a crack with a fissure developing in a direction parallel to the glass substrate has a structure in which a fragment sticks in a scale-like form to the main body part of the glass substrate, and therefore the crack shines glitteringly. The reflected light does not contribute to emission of light as a matter of course.

Thus, an object of the present invention is to further improve the solar cell module disclosed in Patent Document 3 to provide a solar cell module which has a high anti-glare property and is capable of maintaining the power output at a high level. Another object of the present invention is to provide a method for producing the above-mentioned solar cell module.

Solution to Problem

For solving the problems described above, the present inventors further observed a crack portion in an enlarged form to study reflection of light at the crack portion.

The present inventors conducted experiments while changing the components of an antireflection film, the viscosity of the antireflection film in a liquid state, and the method for forming the antireflection film, and penetrated the antireflection film into the gap of the crack. Evaluation of anti-glare performance showed that better results were obtained as compared to the solar cell module disclosed in Patent Document 3.

One aspect of the present invention completed on the basis of the above-mentioned findings is a solar cell module including a plate body made of glass and having a macroscopically flat surface, and a photoelectric conversion unit, the solar cell module generating electricity in the photoelectric conversion unit by making light incident from the plate body to the photoelectric conversion unit, wherein the surface of the plate body is microscopically roughened to include a large number of lateral cracks having a component parallel to the macroscopically flat surface of the plate body observed macroscopically; an antireflection film is laminated on the surface of the plate body, and a part of a substance for forming the antireflection film penetrates into the lateral cracks; and at least one of the lateral cracks having the substance in a space thereof is filled with the substance over a whole region in a thickness direction of the plate body.

Here, the term "lateral" in the lateral crack means "having a component parallel to the macroscopically flat surface."

The solar cell module of this aspect has a structure in which a substance for forming an antireflection film is penetrated into a lateral crack formed in the vicinity of a light-incident surface. Accordingly, light applied to the light-incident surface is less reflected at portions in which cracks are formed, and travels toward the inner part side (optical semiconductor element side) of the solar cell module. That is, the amount of light arriving at the inner part side of the solar cell module can be increased, so that the power output can be maintained at a high level. Irregularities are formed on the surface to disperse reflected light, and in addition, reflection at crack portions is suppressed, so that the amount of reflected light can be reduced. Accordingly, the anti-glare property can be improved.

Preferably, a portion in which a substance for forming the antireflection film penetrates into one of the lateral cracks over 3 micrometers or more exists on at least a part of the plate body when a cross-section cutting through the plate body in the thickness direction is observed.

Ideally, the antireflection film is desired to extend over the whole region of the inside of the lateral crack. However, in the present invention, a lateral crack that is actually formed has a small opening area, and therefore it is impossible to cause the antireflection film to extend over the whole region of the inside of the lateral crack.

On the other hand, it is often the case that the innermost part of the crack is not fully separated, and therefore reflection at such a part is smaller than reflection in the vicinity of the opening. That is, in the vicinity of the opening of the crack, the main body part and the fragment part are fully separated from each other, and therefore the reflecting area is wide, but at the innermost part, which is in somewhat of a joint state, the area contributing to reflection is small. Therefore, when a part of the substance for forming the antireflection film penetrates over 3 micrometers or more into the lateral crack, significantly different results with respect to conventional technologies are obtained.

Preferably, at least a part of the plate body has a region where 10 or more of the lateral cracks each having a maximum component parallel to the macroscopically flat surface of 4 micrometers or more exist per $1.69 \times 10^4$ square micrometers when the plate body is planarly observed, i.e., projected into a plane parallel to the plate body as a whole.

Preferably, at least a part of the plate body has a region where 15 or more of the lateral cracks each having a maximum component parallel to the macroscopically flat surface of 6 micrometers or more exist per $1.69 \times 10^4$ square micrometers when the plate body is planarly observed.

The solar cell modules of these preferred aspects have a large number of lateral cracks, and more remarkably exhibit the effect of the invention.

Preferably, at least a part of the plate body has a region where a plurality of the lateral cracks exist in a 60-micrometer-long range along the macroscopically flat surface, and a total size of components parallel to the macroscopically flat surface of the lateral crack is 8 micrometers or more.

The solar cell module of this preferred aspect also has a large number of lateral cracks, and more remarkably exhibits the effect of the invention.

Preferably, a refractive index of the antireflection film to light having a wavelength of 600 nm is 1.35 to 1.60.

Preferably, the antireflection film is formed of a substance containing fine particles composed of titanium oxide and silicon oxide.

The refractive index of the antireflection film employed in this preferred aspect can be set to a value between the refractive index of the glass and the refractive index of air. Accordingly, regular reflection at the glass surface can be suppressed. When the purpose is only prevention of reflection at the glass surface, the refractive index of the antireflection film is ideally 1.30 to 1.4, a value that is just the middle between the refractive index of air (1.0) and the refractive index of the glass (about 1.5 to 1.6). However, in this aspect, not only reflection at the outermost surface is prevented, but also the antireflection film is penetrated into the crack to suppress reflection at the interface of the glass/antireflection film/glass. In this case, when the refractive index of the antireflection film is made equal to the refractive index of the glass, reflection at the interface of the glass/antireflection film/glass in the crack ideally becomes zero. Therefore, the refractive index of the antireflection film is preferably 1.60 or less for suppressing reflection at the glass surface, and is preferably 1.35 or more for suppressing reflection at the interface of the glass/antireflection film/glass in the crack.

Preferably, an arithmetic mean deviation of the light-incident surface is 0.4 to 2.0 micrometers.

Another aspect of the present invention is a method for producing the solar cell module, the method including a first roughening step of roughening the surface of the plate body by colliding a blasting abrasive material to the surface of the plate body to perform blast processing; a second roughening step of roughening the surface of the plate body again by colliding a blasting abrasive material, which has a particle size smaller than that in the first roughening step, to the surface of the plate body to perform blast processing after the first roughening step; and an antireflection film forming step of forming the antireflection film for forming the antireflection film on the surface of the plate body, and penetrating the antireflection film into the cracks of the plate body.

This aspect relates to the above-mentioned method for producing a solar cell module. In this aspect, blast processing is performed twice. Here, in the first roughening step, a blasting abrasive material having a large particle size is used, and therefore a strong impact is given to the glass substrate, so that the surface of the plate body is picked to form an irregular shape. However, a large number of cracks are generated as described above.

Thus, in the production method of this aspect, the second roughening step is carried out to remove many of the cracks generated in the first roughening step.

That is, in the second roughening step, a blasting abrasive material having a particle size smaller than that in the first roughening step is used. Therefore, in the second roughening step, the ability to roughen the surface of the plate body is low, but an ability to rupture portions having low rigidity is exhibited. Therefore, crack portions having low rigidity are ruptured, and resultantly, the number of cracks is reduced.

Further in this aspect, the antireflection film is provided thereon, and a part of the antireflection film is penetrated into the remaining cracks.

Preferably, the antireflection film forming step is carried out without performing a hydrophilization treatment using a hydrophilization agent, and in the antireflection film forming step, a liquid for forming the antireflection film is spray-applied.

According to this preferred aspect, the material of the antireflection film easily penetrates into the crack.

Preferably, a washing step of washing the surface of the plate body is carried out prior to the antireflection film forming step.

It is recommended that the abrasive material to be used in the first roughening step have a size in a range of #40 to #600 in terms of a nominal count.

It is recommended that the abrasive material to be used in the second roughening step have a size in a range of #400 to #3000 in terms of a nominal count.

It is recommended that white alumina be used in the abrasive material.

Effect of the Invention

According to the present invention, there can be provided a solar cell module which is capable of exhibiting a high anti-glare property and maintaining the power output at a high level.

BRIEF DESCRIPTION OF THE DRAWINGS

FIGS. 2A) to 2C) are conceptual schematic views showing the solar cell module in FIG. 1, where FIG. 2A is an enlarged plan view; FIG. 2B is an A-A sectional view of FIG. 2A and FIG. 2C is an enlarged sectional view in which FIG. 2B is further enlarged.

FIG. 7A is a photograph showing a scanning electron microscope (SEM) image; and FIG. 7B shows a trace diagram of FIG. 7A.

FIG. 8A is a photograph showing an SEM image; and FIG. 8B shows a trace diagram of FIG. 8A.

FIG. 9A is a photograph showing an SEM image; and FIG. 9B shows a trace diagram of FIG. 9A.

FIG. 10A is a photograph showing an SEM image; and FIG. 10B shows a trace diagram of FIG. 10A.

FIG. 13A is a photograph showing an SEM image; and FIG. 13B shows a trace diagram of FIG. 13A.

FIG. 14A is a photograph showing an SEM image; and FIG. 14B shows a trace diagram of FIG. 14A.

FIG. 15A is a photograph showing an SEM image; and FIG. 15B shows a trace diagram of FIG. 15A.

FIGS. 16A and 16P are views showing a part of FIGS. 15A and 15B in an enlarged form, where FIG. 16A is a photograph showing an SEM image.

FIGS. 19A and 19B are reference photographs showing a state in which an antifouling property test is conducted for the solar cell module according to Example 2 in the present invention and the solar cell module formed by the conventional technology, where FIG. 19A shows an experiment in which stains deposited by scattering sand are removed; and FIG. 19B shows an experiment in which stains deposited by using a pencil and an oil-based pen are removed.

FIG. 20B corresponds to an anti-glare glass plate.

FIG. 21B 0 shows a trace diagram of FIG. 21A.

FIG. 22A is a photograph showing an SEM image; and FIG. 22B shows a trace diagram of FIG. 22A.

FIG. 23A is a photograph showing an SEM image; and FIG. 23B shows a trace diagram of FIG. 23A.

FIG. 24A is a photograph showing an SEM image; and FIG. 24B shows a trace diagram of FIG. 24A.

FIG. 25A is a photograph showing an SEM image; and FIG. 25B shows a trace diagram of FIG. 25A.

FIG. 26A is a photograph showing an SEM image; and FIG. 26 shows a trace diagram of FIG. 26A.

FIG. 27A is a photograph showing an SEM image; and FIG. 27B shows a trace diagram of FIG. 27A.

FIG. 28A is a photograph showing an SEM image; and FIG. 28B shows a trace diagram of FIG. 28A.

FIG. 29A is a photograph showing an SEM image; and FIG. 29B shows a trace diagram of FIG. 29A.

FIG. 30A is a photograph showing an SEM image; and FIG. 30B shows a trace diagram of FIG. 30A.

FIG. 31A is a photograph showing an SEM image; and FIG. 31B shows a trace diagram of FIG. 31A.

FIG. 34A is a sectional view of the vicinity of a light-incident surface; FIG. 34B is an enlarged view of FIG. 34A; and FIG. 34C is a partial enlarged view in which a part of FIG. 34B is further enlarged.

FIG. 35A is an enlarged plan view; FIG. 35B is an A-A sectional view of FIG. 35A; and FIG. 35C is an enlarged sectional view in which FIG. 35B is further enlarged.

MODES FOR CARRYING OUT THE INVENTION

Hereinafter, a solar cell module 1 of the present invention will be conceptually described.

Figure 1:
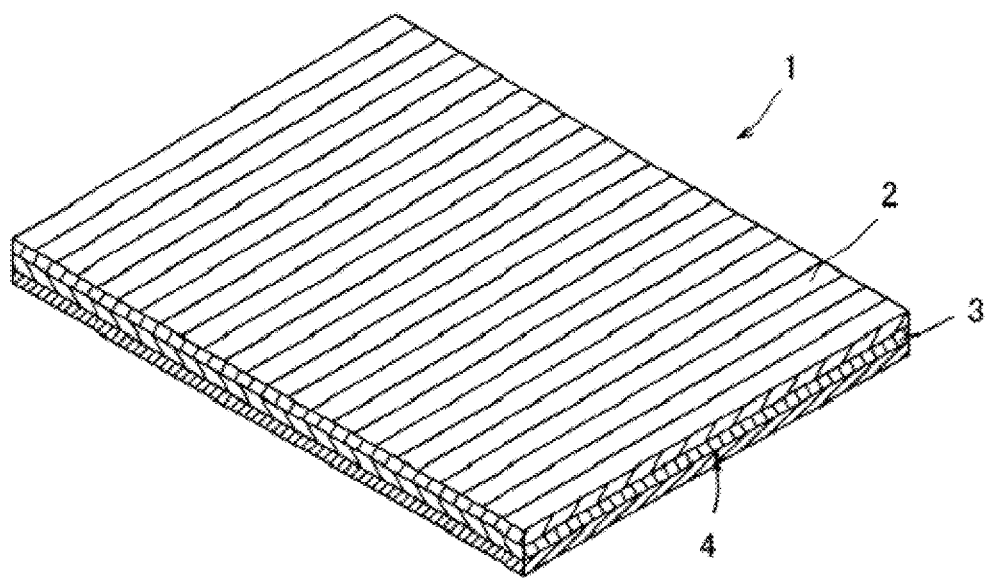
FIG. 1 is a partially cutaway perspective view showing a solar cell module according to an embodiment of the present invention.

The solar cell module 1 of this embodiment is referred to as a thin-film-type solar cell module, and has a photoelectric conversion unit 3 laminated on the back surface side of a glass substrate 2 as shown in FIG. 1. The photoelectric conversion unit 3 is formed by laminating a transparent electrode layer 10, a semiconductor thin-film photoelectric conversion layer 11, a back transparent electrode layer 12, and a back metal electrode layer 13 (see FIGS. 5A to 5G).

Further, in this embodiment, a back sheet 4 is provided on the rear surface (surface situated on the lower side in FIG. 1) side of the photoelectric conversion unit 3 as shown in FIG. 1.

In the solar cell module 1 of this embodiment, electricity is produced by making light incident from the surface side of the glass substrate 2 to the photoelectric conversion unit 3 side. That is, one surface of the glass substrate 2 forms a light-incident surface of the solar cell module 1.

The surface of the glass substrate 2 employed in this embodiment is a smooth surface as shown in FIG. 1 when macroscopically observed, but the surface of the glass substrate 2 is rough and has fine irregularities when microscopically observed. That is, as shown in FIGS. 2A to 2C, the surface of the glass substrate 2 has been physically processed and is intentionally irregularly shaped. Specifically, the surface of the glass substrate 2 has a roughness of 0.4 micrometer to 2.0 micrometers in terms of an arithmetic mean deviation.

The glass substrate 2 has cracks 18. The cracks 18 include lateral and fine cracks 18 (hereinafter, also referred to as lateral cracks 18) having components extending in a direction parallel to the macroscopically flat surface of the glass substrate 2.

Figure 3:
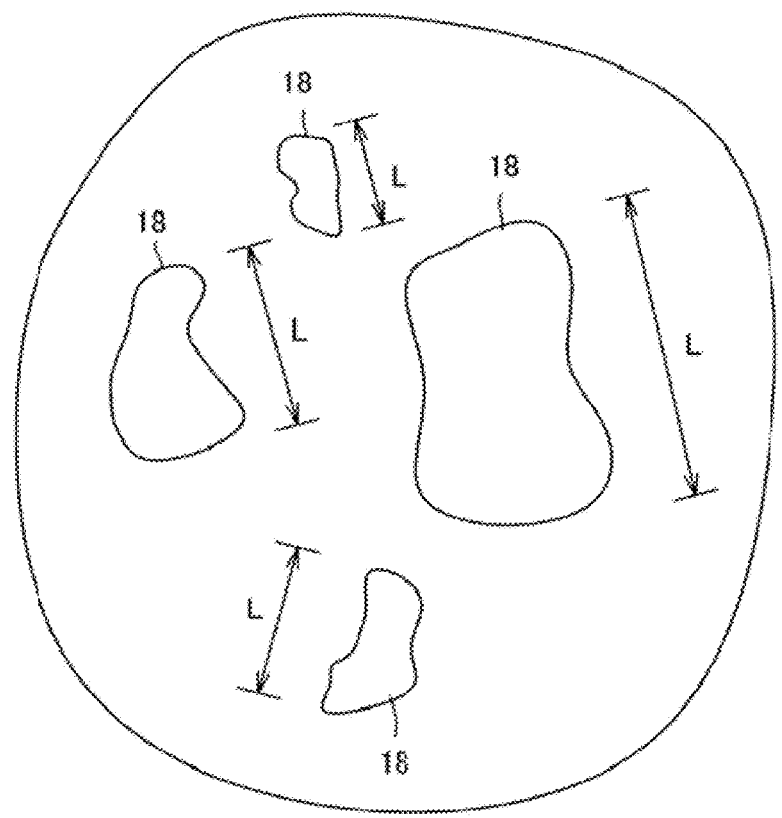
FIG. 3 is an explanatory view showing the crack portions of FIG. 2 in an enlarged form.

The crack 18 has a scaly and complicated shape when observed in plan view, but for the sake of convenience of explanation, the longest dimension in plan view is given a symbol L (see FIG. 3). In the descriptions below, this dimension is abbreviated as a maximum diameter L. The maximum diameter L can be said to be a maximum component in a direction parallel to the macroscopically flat surface in each crack 18.

In the solar cell module 1 of this embodiment, 10 or more lateral cracks 18 having a maximum diameter of 4 micrometers or more exist per $1.69 \times 10^4$ square micrometers. The lateral cracks 18 are generated incidentally, and therefore their distribution is not uniform. In this embodiment, there exist at least a plurality of regions where 15 or more lateral cracks 18 having a size of 6 micrometers or more exist per $1.69 \times 10^4$ square micrometers.

As shown in FIG. 2B, there exist a plurality of lateral cracks 18 along the macroscopically flat surface when a cross-section cutting through the glass substrate 2 in the thickness direction is observed.

As described above, the lateral cracks 18 are generated incidentally, and therefore their distribution is not uniform. In this embodiment, there exist a plurality of the areas having the length of 60-micrometers along the macroscopically flat surface, which includes a plurality of cracks 18 having the total length of 8 micrometers or more in the direction parallel to the macroscopically flat surface.

Further, in the solar cell module 1 of this embodiment, the antireflection film 19 is laminated on the surface of the glass substrate 2.

The antireflection film 19 is formed by air-drying a water-soluble titania silicon coating agent, and in this embodiment, a part of the antireflection film penetrates into a lateral crack 18.

The penetration of the antireflection film 19 into the lateral crack 18 is intentionally performed, but actually, the antireflection film 19 cannot penetrate into the lateral crack 18 to the deepest part, and penetrates only to a part of the depth.

However, when a cross-section cutting through the glass substrate 2 in the thickness direction is observed, a portion in which a substance for forming the antireflection film 19 penetrates into the lateral crack 18 over 3 micrometers or more exists at a plurality of locations of the glass substrate 2.

In the crack 18 into which the antireflection film 19 penetrates, gaps formed in the crack 18 are closed by the antireflection film 19, so that light is not easily reflected at the interface of the crack 18.

Figure 4:
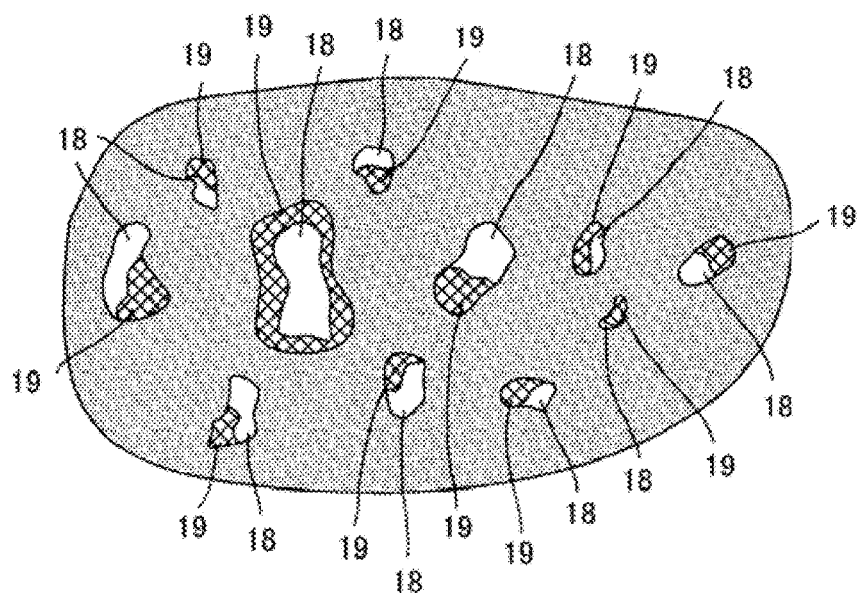
FIG. 4 is an explanatory view showing a state in which crack portions shine white in a solar cell module according to an embodiment of the present invention.
Figure 36:
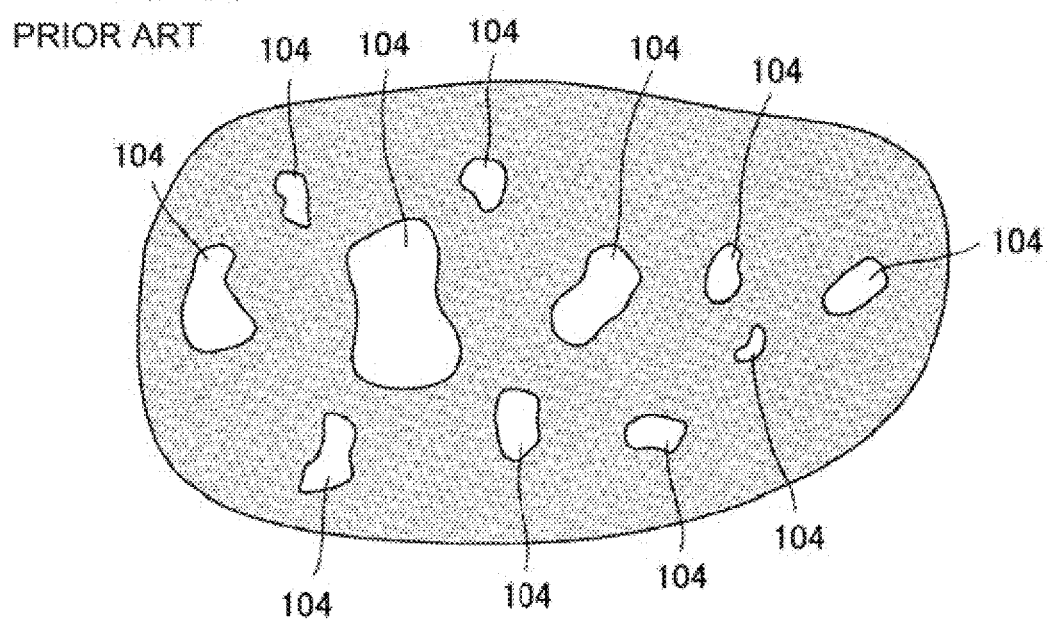
FIG. 36 is an explanatory view showing a state in which crack portions shine in the solar cell module formed by the conventional technology.

Therefore, when the surface of the solar cell module 1 is observed, reflection of incident light at the crack 18 is reduced (the portion shining white is smaller) as compared to the surface in the conventional technology (see FIG. 36) as shown in FIG. 4.

The solar cell module 1 described above is one that is referred to as a so called thin-film type. However, the present invention is not limited to this example as a matter of course.

The present invention is employed not only for solar cell modules referred to as a so called thin-film type, but may also be employed for solar cell modules including a type referred to as a crystal type.

That is, the present invention may be applied to a solar cell module obtained by doping a semiconductor wafer of polycrystalline silicon, etc., with phosphorus, boron, or the like to prepare a solar cell, and providing a glass plate for the purpose of protecting the surface of the solar cell. The present invention may be applied to a protecting glass plate that is used in this type of solar cell module.

That is, the present invention can be suitably employed in any solar cell with glass (cover glass) disposed on the light-incident surface.

EXAMPLES

Next, specific examples of the present invention will be described.

Example 1

A solar cell module 1 in this example is a thin-film-type and integrated-type solar cell module.

That is, the solar cell module 1 of this example is one obtained by forming a transparent electrode layer 10, a semiconductor thin-film photoelectric conversion layer 11, a back transparent electrode layer 12, and a back metal electrode layer 13 on a glass substrate 2 by film forming means, and can be said to be a thin-film-type solar cell module.

The solar cell module 1 of this example is one produced through the following steps.

The step of producing the solar cell module 1 is divided broadly into a photoelectric conversion unit production step and a surface treatment step. Among them, the photoelectric conversion unit production step is identical to that of a known solar cell module production step, and is thus described briefly.

Figure 5A:
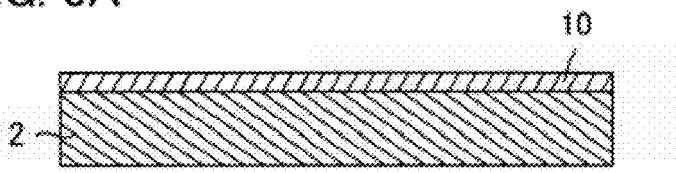
FIGS. 5A to 5G are explanatory views showing photoelectric conversion unit production steps carried out before a surface treatment in the production steps of the solar cell module in FIG. 1, with the solar cell module being formed in the order of FIGS. 5A to 5G.
Figure 5B:
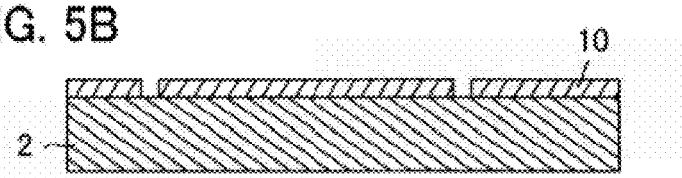
Figure 5C:
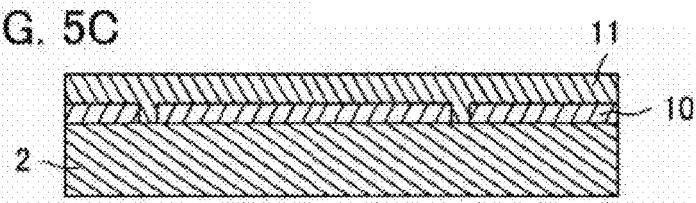

In the photoelectric conversion unit production step, as shown in FIGS. 5A to 5G, first the transparent electrode layer 10 is formed on the back surface side (surface situated at a position opposite to the light-incident surface) of the glass substrate 2 (see FIG. 5A), and laser scribing is performed to divide the formed transparent electrode layer 10 (see FIG. 5B).

Figure 5D:
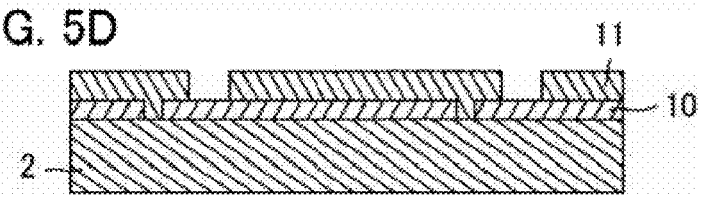
Figure 5E:
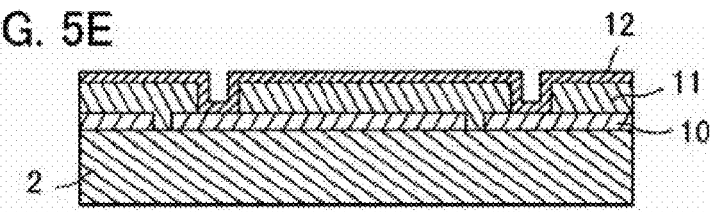
Figure 5F:
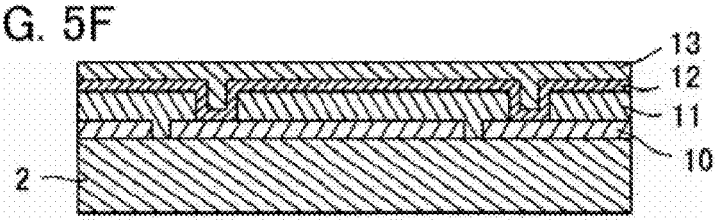
Figure 5G:
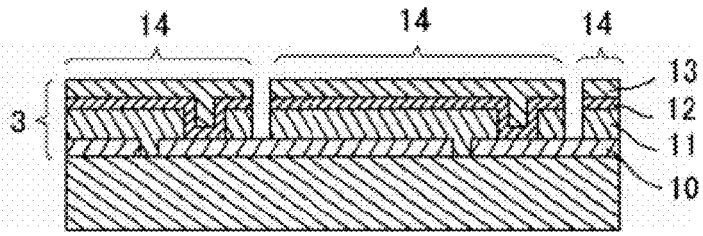

Subsequently, the semiconductor thin-film photoelectric conversion layer 11 is formed on the transparent electrode layer 10 (see FIG. 5C), and laser scribing is performed to divide the formed semiconductor thin-film photoelectric conversion layer 11 (see FIG. 5D). Further, as a back electrode, the back transparent electrode layer 12 and the back metal electrode layer 13 are formed (see FIGS. 5E and 5F). Laser scribing is performed to appropriately divide the formed back transparent electrode layer 12 and back metal electrode layer 13 (see FIG. 5G).

Through these steps, a plurality of solar cells 14 are formed, and they are mutually electrically connected. That is, a photoelectric conversion unit 3 is a laminated body formed by stacking a plurality of layers, and is an optical semiconductor element formed by integrating a plurality of solar cells 14.

The formed photoelectric conversion unit 3 is protected with a resin and a back sheet 4 (see FIG. 1, etc.) to complete the photoelectric conversion unit production step.

Subsequently, the surface treatment step of subjecting the light-incident surface of the glass substrate 2 to a surface treatment is carried out.

The surface treatment step is further divided into a roughening step, a water-washing step, and an antireflection film forming step.

In the roughening step, a surface of the glass substrate 2 is subjected to blast processing for forming an irregular surface on the light-incident surface of the glass substrate 2.

The blast processing is one in which sand blasting is performed using an abrasive material. As the abrasive material, white alumina can be suitably employed, and an abrasive material having a size in a range of #40 to #600 in terms of a nominal count can be suitably employed.

When the roughening step is carried out, an irregular surface is formed on the light-incident surface of the glass substrate 2. That is, when blast processing is performed, a large number of fine lateral cracks are formed on the surface of the glass substrate 2.

Figure 6:
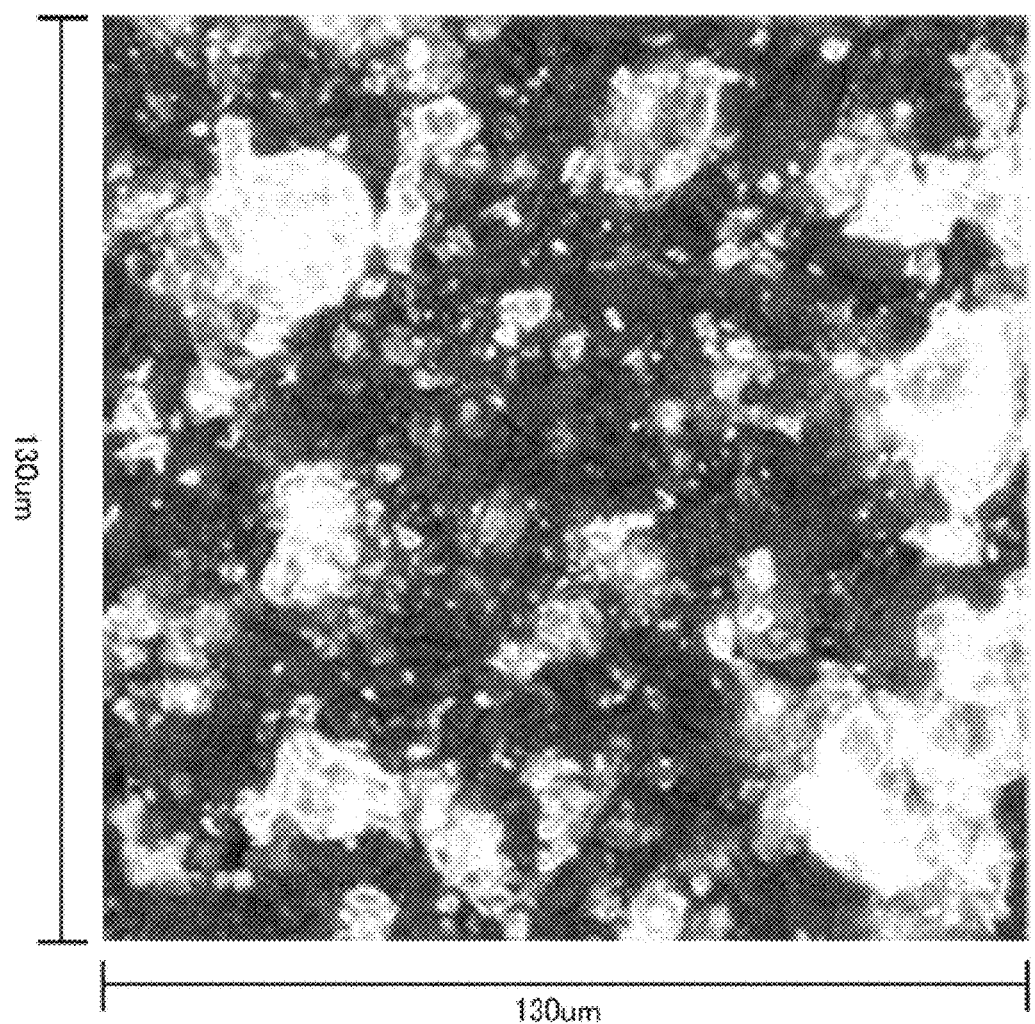
FIG. 6 is an optical image showing a surface of a glass substrate after the roughening step.
Figure 7A:
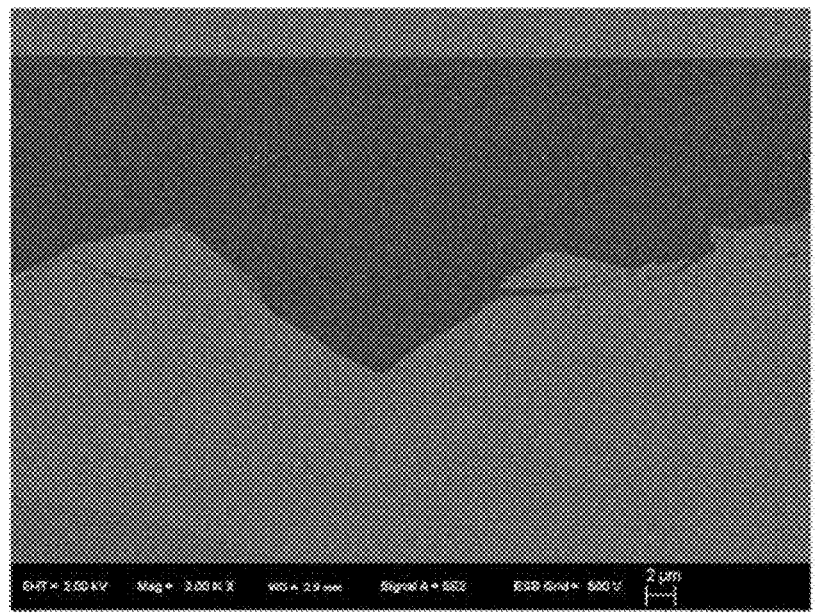
FIGS. 7A and 7B are views showing the vicinity of a light-incident surface of a solar cell module according to Example 1 in the present invention, where
Figure 7B:
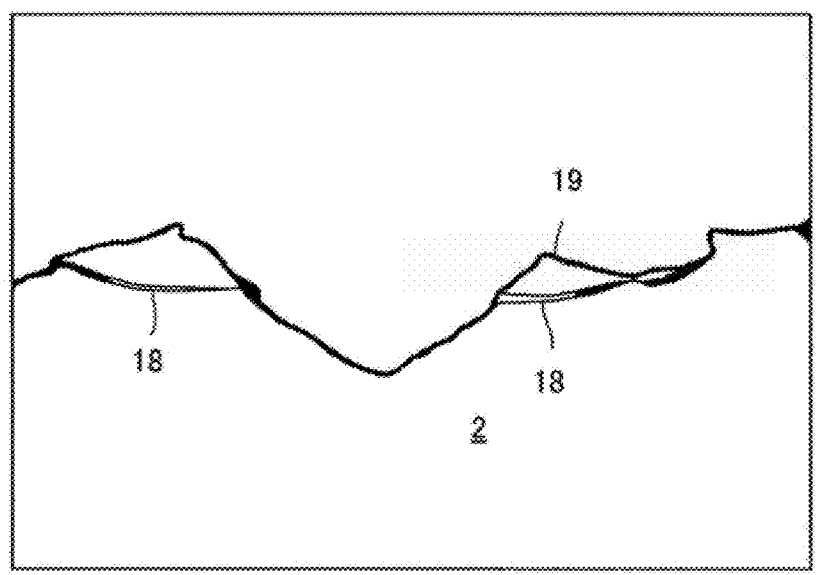
Figure 8A:
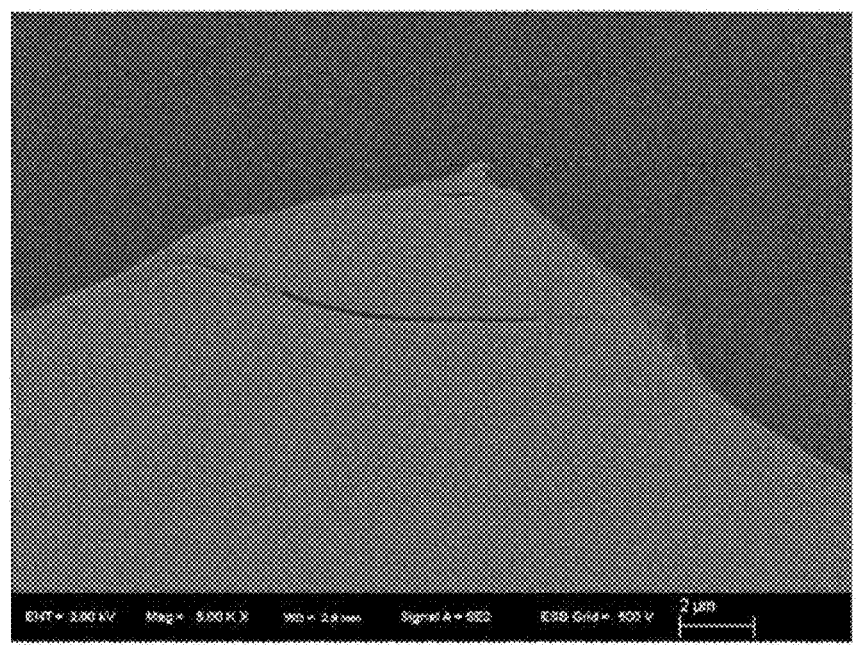
FIGS. 8A and 8B are views showing a part of FIGS. 7A and 7B in an enlarged form, where
Figure 8B:
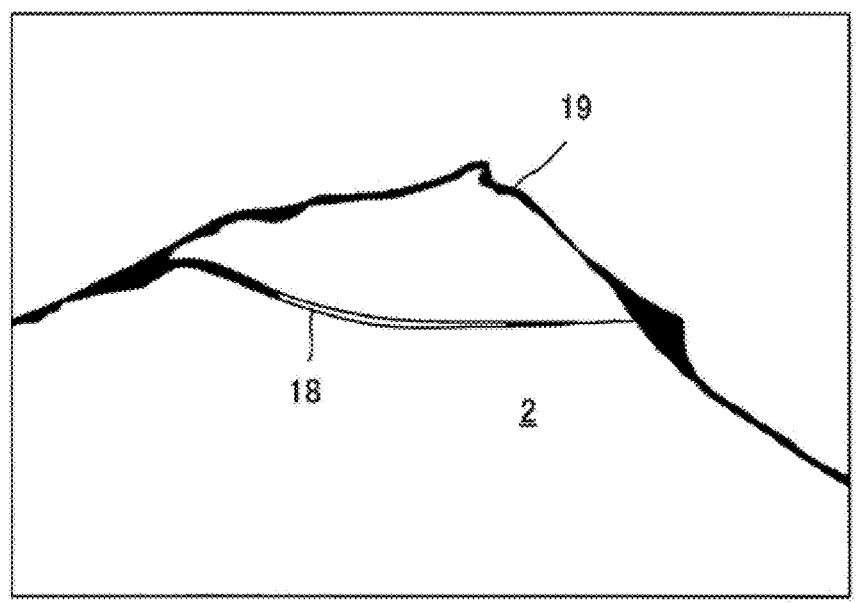
Figure 9A:
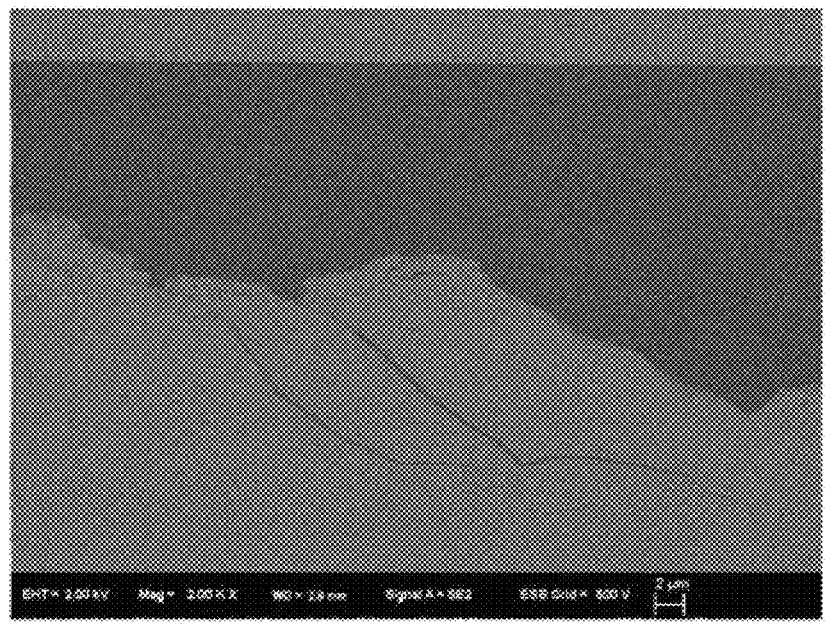
FIGS. 9A and 9B are views showing a portion different from that in FIGS. 7A and 7B in the vicinity of the light-incident surface of the solar cell module according to Example 1 in the present invention, where
Figure 9B:
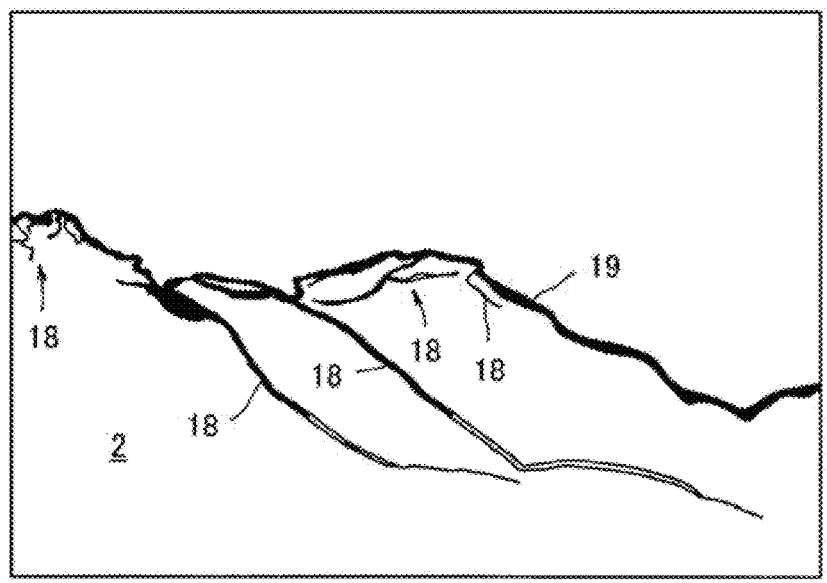

FIG. 6 is a microscope photograph (optical image) showing the surface of the glass substrate 2 after the blast processing, where the portion appearing white is a lateral crack.

Subsequent to the roughening step, the water-washing step is carried out. This step is a step of washing the blast-processed glass substrate with water. Specifically, the water-washing step is a step of washing a portion as the light-incident surface of the glass substrate 2 using city water.

Further, the antireflection film forming step is carried out.

In the antireflection film forming step, a water-soluble titania silicon coating agent containing fine particles composed of a titanium oxide and a silicon oxide are applied by a spray, and air-dried to form an antireflection film 19 (see FIG. 2). The antireflection film forming step is a step of forming the antireflection film 19 (see FIG. 2) without performing a hydrophilization treatment using a hydrophilization treatment agent.

An antireflection film was formed on a flat glass substrate in a step identical to the step of forming the antireflection film 19, and a refractive index at a wavelength of 600 nm was measured using spectroscopic ellipsometry. As a result, the refractive index was 1.43.

The solar cell module 1 is completed upon completion of the antireflection film forming step.

FIGS. 7A to 10B are cross-section-enlarged photographs (scanning electron microscope images: SEM images) of the glass substrate 2 after completion of the antireflection film forming step. As is evident in FIGS. 7A to 10B, it is confirmed that a part of the antireflection film 19 penetrates into lateral cracks. Cross-section-enlarged photographs (SEM images) as shown in FIGS. 7A to 10B can be obtained with a magnification of several hundred times to several thousand times.

Figure 10A:
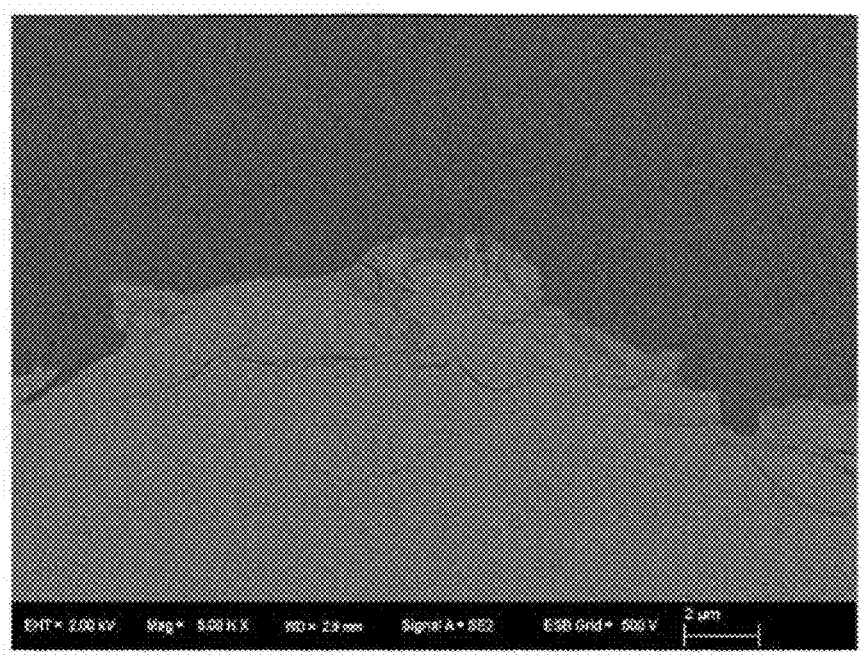
FIGS. 10A and 10B are views showing a portion different from those in FIGS. 7A, 7B, 9A and 9B in the vicinity of the light-incident surface of the solar cell module according to Example 1 in the present invention, where
Figure 10B:
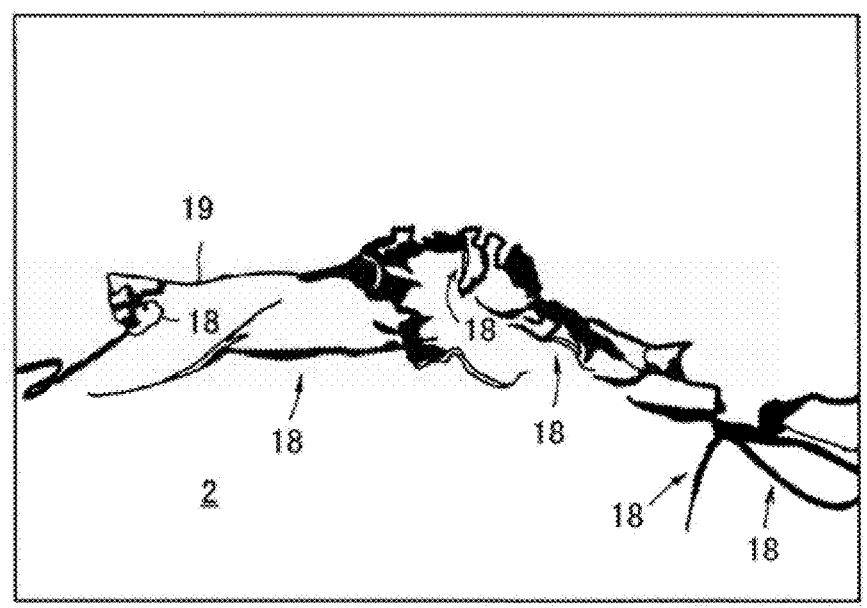

That is, when attention is paid to the formed irregular surface, as shown in, for example, FIGS. 10A and 10B, a large number of very fine cracks 18 are formed in the vicinity of the light-incident surface side (upper side in FIGS. 10A and 10B) of the glass substrate 2, and include cracks extending in a direction along which horizontal components are included. A substance (the above-mentioned water-soluble titania silicon coating agent) for forming the antireflection film 19 penetrates into the crack 18.

When a substance for forming the antireflection film 19 penetrates into the crack 18 in this way, reflected light is suppressed so that the anti-glare property of the solar cell module 1 can be improved.

Specifically, when a part of the antireflection film 19 penetrates into the crack 18, reflection to the outer side is suppressed at a portion in which the antireflection film 19 penetrates into the crack 18, and light travels toward the photoelectric conversion unit 3 as shown in FIG. 2C. That is, it can be said that the reflectance in the vicinity of the crack 18 is low.

Figure 35A:
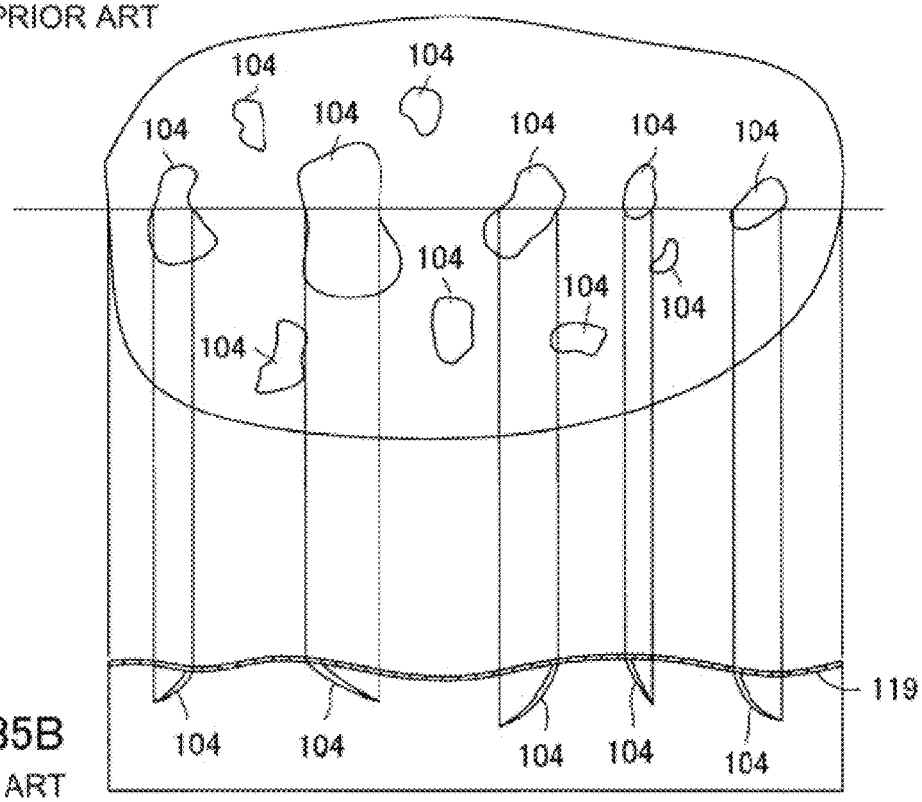
FIGS. 35A to 35C are schematic views conceptually showing the solar cell module formed by the conventional technology, where
Figure 35B:
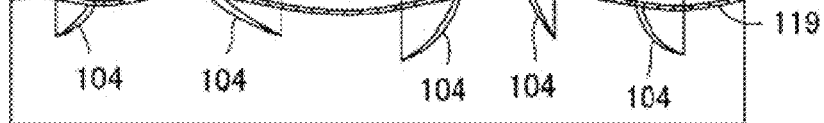
Figure 35C:
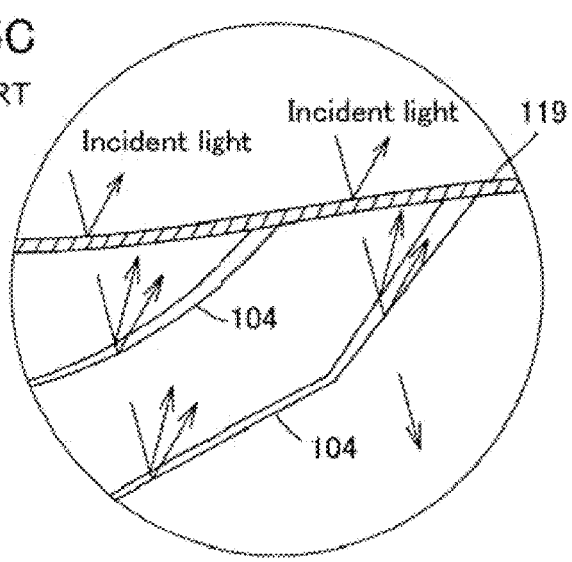

On the other hand, a case is examined where the inside of a crack 104 is not filled with a substance for forming the antireflection film 119, i.e. where the inside of the crack 104 is filled with air as shown in FIG. 35C. In this case, air filling the inside of the crack 104 causes a layer of air to be formed in the glass substrate 2.

In this case, since a layer of air is formed in the glass substrate 2, a part of light which is about to enter from the inner part side of the crack 104 to the photoelectric conversion unit 3 side (the lower side in FIG. 35C and the inner part side of the solar cell module 1) is reflected to the outer part side. That is, light applied from the outside of the glass substrate 2 is not only reflected at the outermost surface, but also reflected at two locations, the interface between the glass and air and the interface between air and the glass, each time it passes through the lateral crack 104, so that the light is highly reflected. The amount of light reaching the photoelectric conversion unit 3 decreases, so that the power output of the solar cell is reduced, and the amount of reflected light increases.

On the other hand, as described above, the solar cell module 1 of this example has a structure in which the inside of the crack 18 is filled with a substance for forming the antireflection film 19, and thus incident light is not highly reflected in the vicinity of the crack 18. Therefore, the amount of light reaching the photoelectric conversion unit 3 can be increased, and the amount of reflected light can be reduced, so that it is possible to increase the power output of the solar cell module 1 and improve the anti-glare property of the solar cell module 1.

For confirming this, the solar cell module 1 of this example was compared to the prior art solar cell module produced by the method disclosed in Patent Document 3. That is, for each of the solar cell modules, the glossiness was measured at an incidence angle of 60 degrees by a method conforming to the specular glossiness measurement method described in JIS Z8741-1997. As a result, the glossiness of the solar cell module 1 of this example was lower by about 12 percent than the glossiness of the prior art solar cell module. Accordingly, it was confirmed that the solar cell module 1 of this example barely cause a glare to be felt when viewed, and thus has a high anti-glare property.

Example 2

A solar cell module 1 of the second example in the present invention is produced through a roughening step, a water-washing step, and an antireflection film forming step similarly to the previous example, but in the roughening step, blast processing is performed over a plurality of times.

That is, the roughening step in the first example is carried out as a first roughening step, and subsequently, a second roughening step is carried out.

Here, the first roughening step is carried out under the same conditions as in the previous example.

In the second roughening step, sand blasting is performed using an abrasive material as well. As the abrasive material, white alumina can be suitably employed, and an abrasive material having a size in a range of #400 to #3000 in terms of a nominal count can be suitably employed.

Here in the second roughening step of this embodiment, an abrasive material having a particle size smaller as compared to the first roughening step is used. By carrying out the second roughening step, defects on the surface which occur in the first roughening step are removed.

By performing the surface treatment including the above-described steps, an irregular surface having an arithmetic mean deviation of 0.4 micrometer to 10 micrometers could be formed, and almost all defects on the glass surface, which had existed at the time of completion of the first roughening step, could be eliminated. More specifically, by using an abrasive material capable of being suitably employed, an irregular surface having an arithmetic mean deviation of 0.4 micrometer to 2 micrometers, more specifically an irregular surface having an arithmetic mean deviation of 0.42 micrometer could be formed.

The antireflection film forming step is carried out under the same conditions as in the previous example.

The solar cell module 1 is completed upon completion of the antireflection film forming step.

Figure 11:
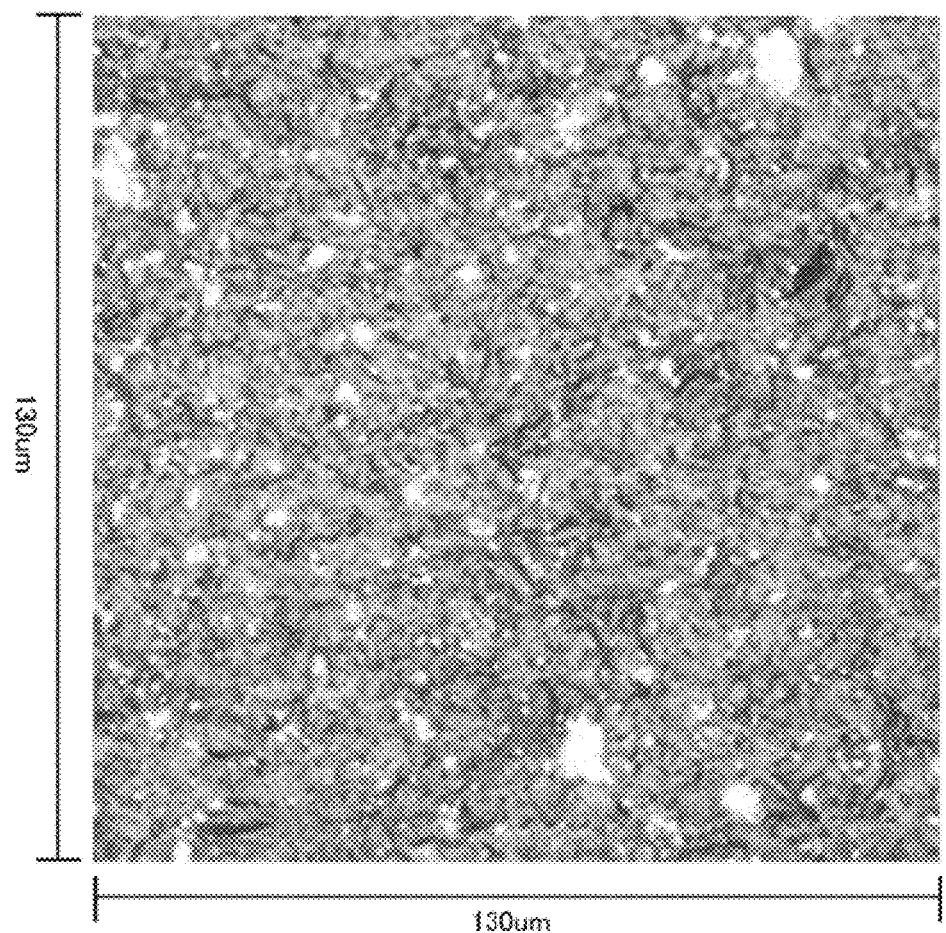
FIG. 11 is an optical image showing the surface of the glass substrate after the first roughening step and the second roughening step are sequentially carried out.

FIG. 11 is a microscope photograph (optical image) showing the surface of the glass substrate 2 after the second roughening step, where the portions appearing white are lateral cracks.

Figure 12:
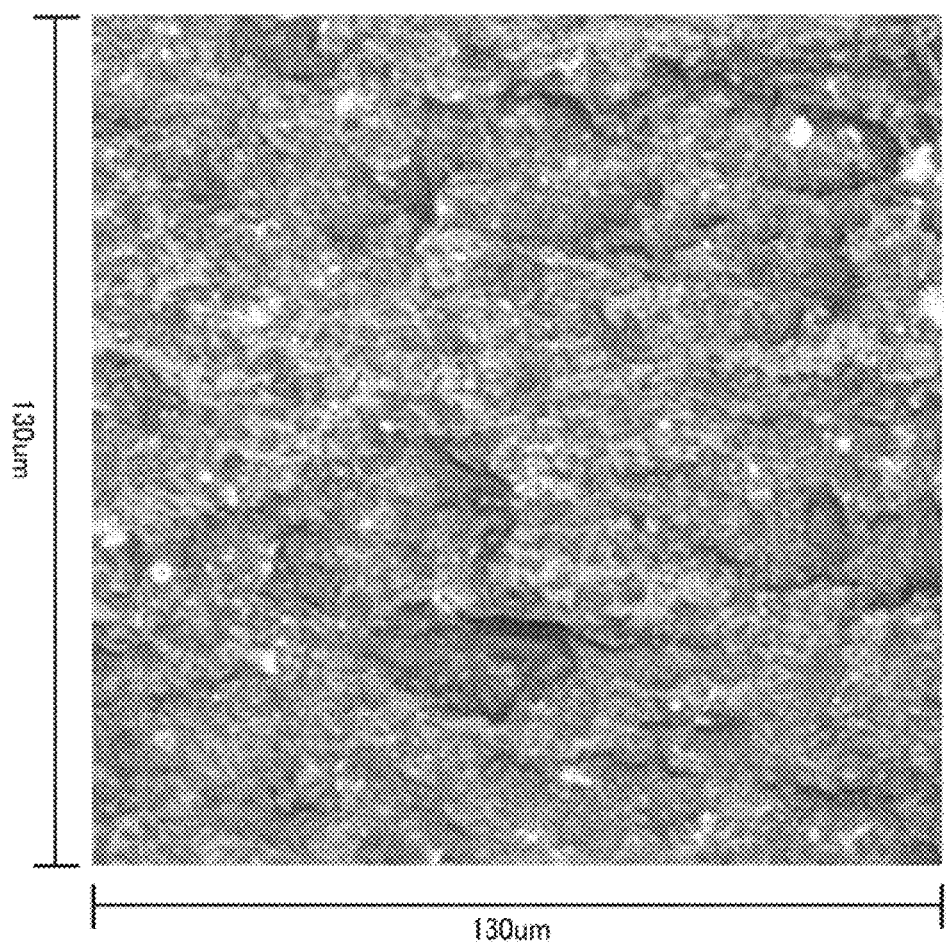
FIG. 12 is an optical image showing the surface of the glass substrate after the first roughening step and the second roughening step are sequentially carried out, and further an antireflection film is formed.
Figure 13A:
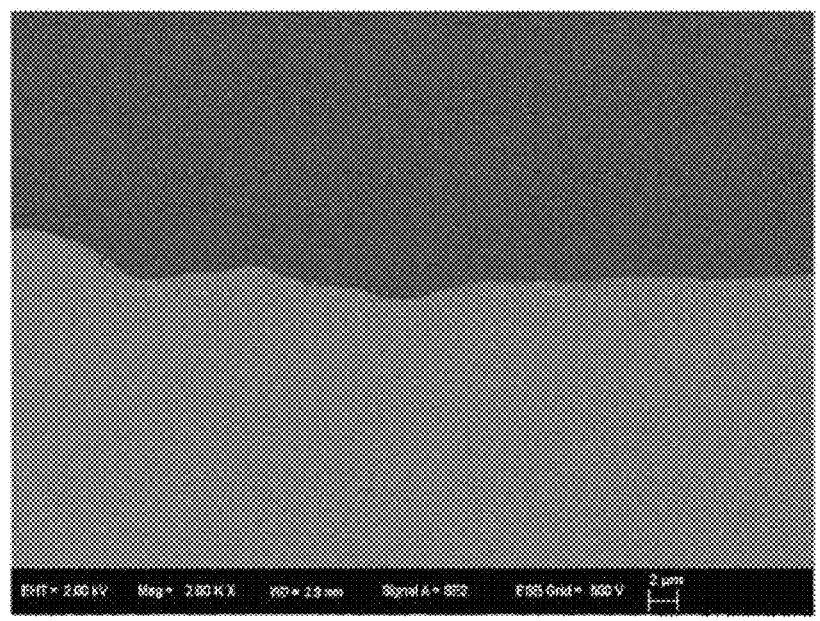
FIGS. 13A and 13B are views showing the vicinity of a light-incident surface of a solar cell module according to Example 2 in the present invention, where
Figure 13B:
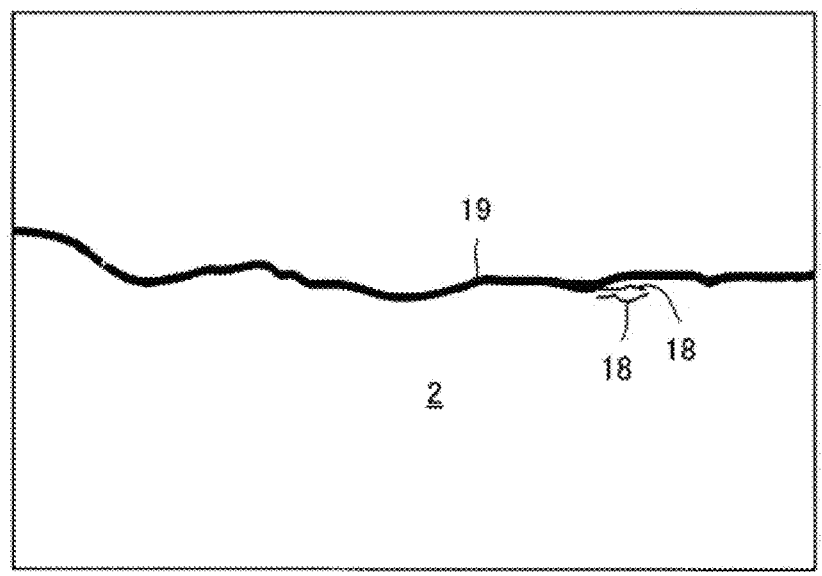
Figure 14A:
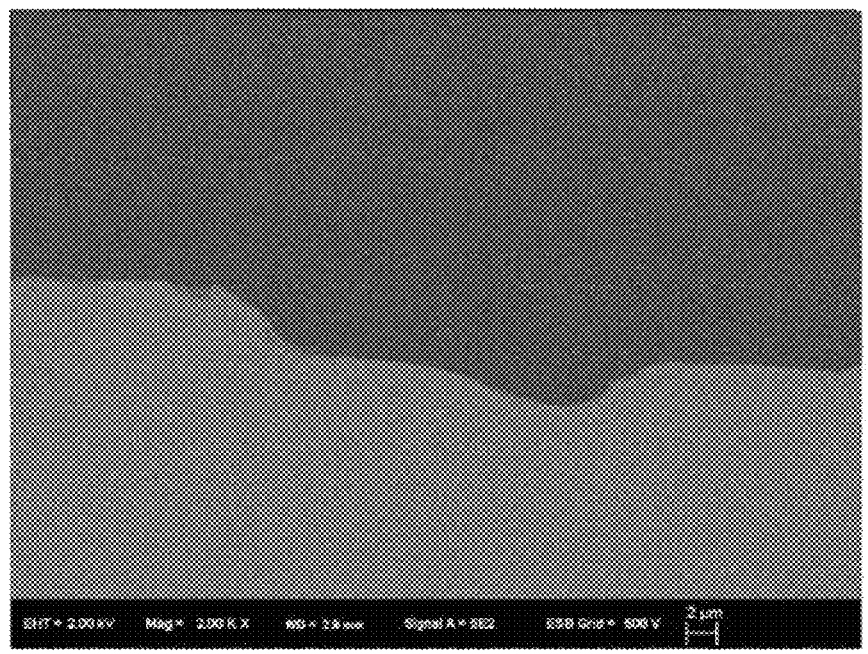
FIGS. 14A and 14B are views showing a portion different from that in FIGS. 13A and 13B in the vicinity of the light-incident surface of the solar cell module according to Example 2 in the present invention, where
Figure 14B:
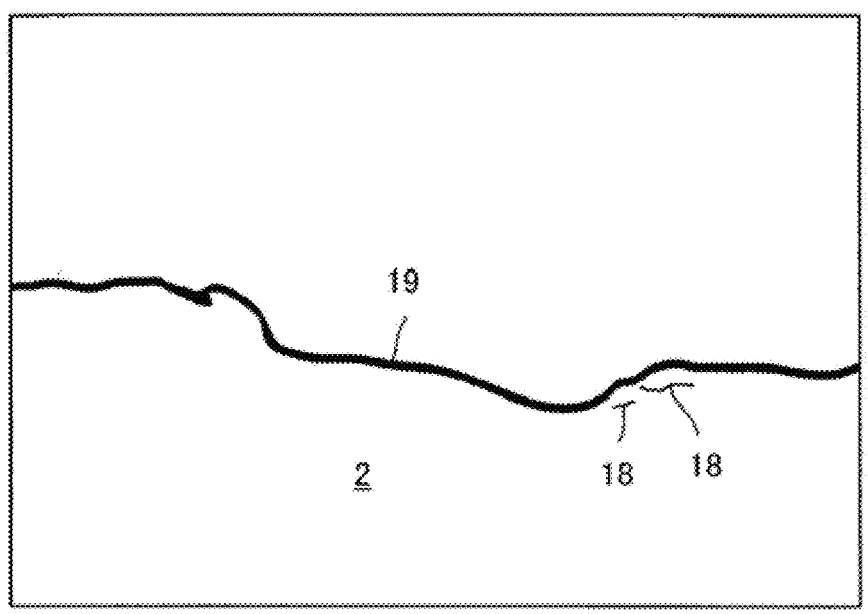
Figure 15A:
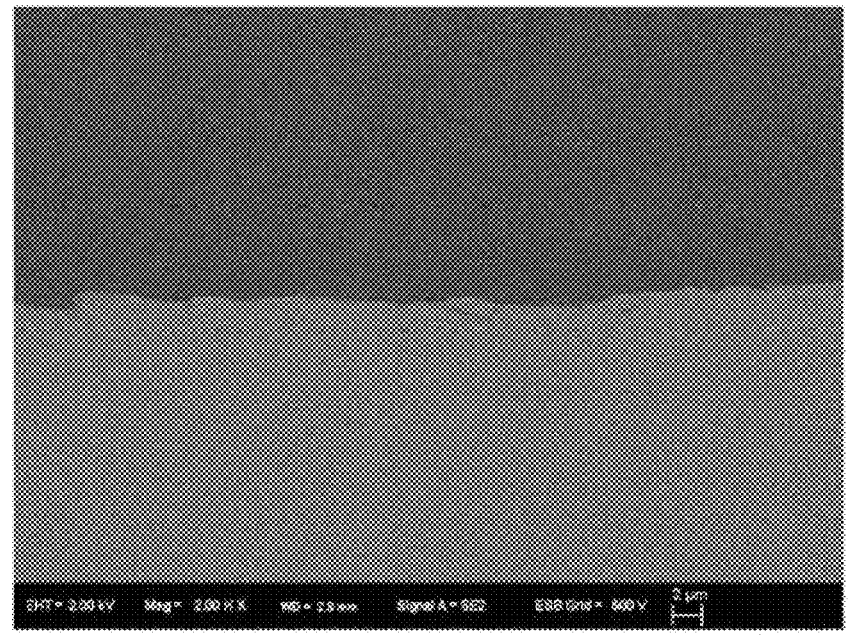
FIGS. 15A and 15B are views showing a portion different from those in FIGS. 13A, 13B, 14A and 14B in the vicinity of the light-incident surface of the solar cell module according to Example 2 in the present invention, where
Figure 15B:
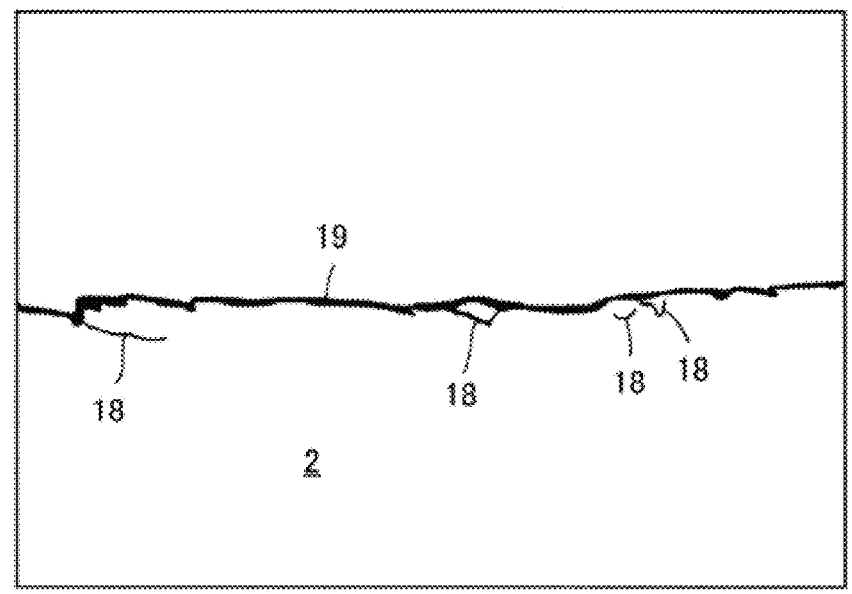

FIG. 12 is a microscope photograph (optical image) showing the surface of the glass substrate 2 after the antireflection film forming step, where the portion appearing white is a portion of the lateral cracks in which the antireflection film does not exist.

It is shown that the reflection of incident light at the cracks is reduced (the number of portions shining white is reduced) by carrying out the antireflection film forming step.

FIGS. 13A to 16B are cross-section enlarged photographs (scanning electron microscope images: SEM images) of the glass substrate after completion of the antireflection film forming step in this example. As is evident in FIGS. 13A to 16B, it is confirmed that a part of the antireflection film 19 penetrates into lateral cracks. Cross-section-enlarged photographs (SEM images) as shown in FIGS. 13A to 16B can be obtained with a magnification of several hundred times to several thousand times.

Figure 16A:
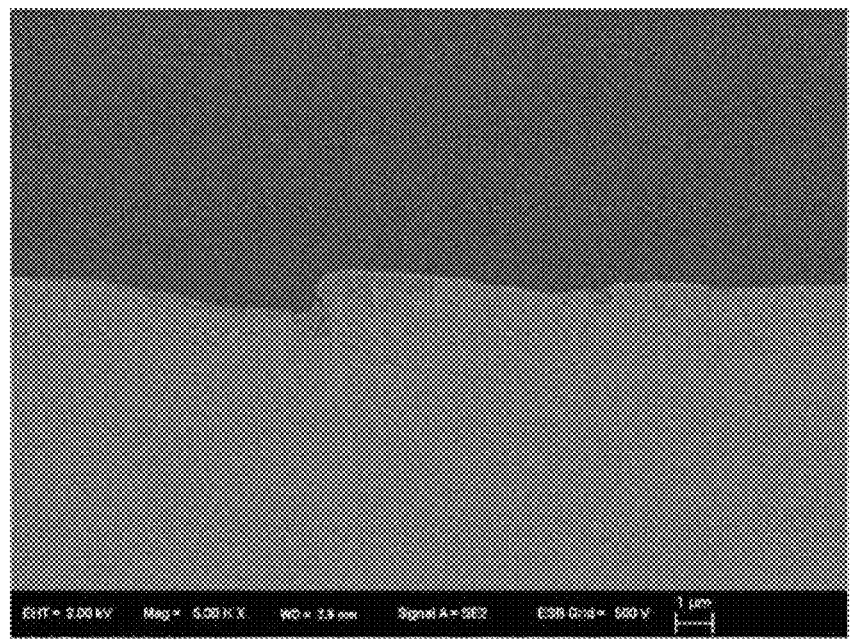
Figure 16B:
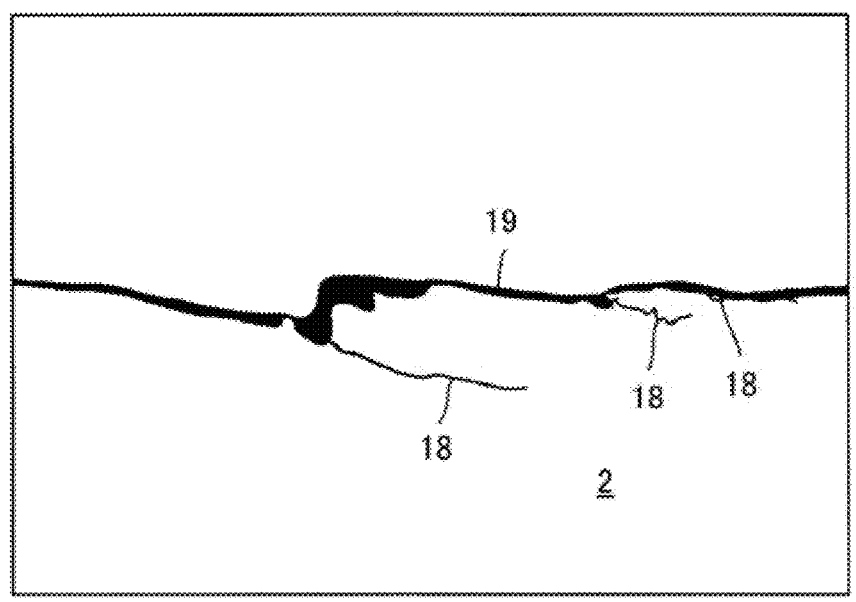
FIG. 16B shows a trace diagram of FIG. 16A.

That is, when attention is paid to the formed irregular surface, as shown in, for example, FIGS. 16A and 16B, a large number of very fine cracks are formed in the vicinity of the light-incident surface side of the glass substrate, and include cracks extending in a horizontal direction. A substance (the above-mentioned water-soluble titania silicon coating agent) for forming the antireflection film penetrates into the crack.

As a result, incident light is not highly reflected at a portion of the crack in which the antireflection film exists. Therefore, the solar cell module 1 has an increased power output, and the anti-glare property is improved.

For the solar cell module 1 of this example, the values of glass surface-cracked area ratio, short-circuit current value retention rate, total reflectivity on the incident surface side, arithmetic mean deviation of the surface, glossiness, and reflected glare were measured.

More specifically, the values were measured before performing the surface treatment, after carrying out the first roughening step, after carrying out the second roughening step, and after carrying out the antireflection film forming step.

The glass surface-cracked area ratio was measured by the following method.

Cracked portions of a surface (light-incident surface) of the glass substrate 2 were identified from an enlarged image of a glass surface of 130 micrometers×130 micrometers. A cracked portion is a region where reflection is stronger as compared to neighboring portions in optical observation with reflected light (e.g. regions appearing white in the optical images shown in FIG. 6, FIG. 11, and FIG. 12). The measurement was performed using a laser microscope (Model: LEXT OLS4000 manufactured by Olympus Corporation).

The arithmetic mean deviation of the surface was measured by the following method.

The measurement was performed with a setting of cutoff λc 80 micrometers using a laser microscope (Model: LEXT OLS4000 manufactured by Olympus Corporation).

The glossiness was measured by the following method.

The glossiness was measured at an incidence angle of 60 degrees using a glossimeter (Gloss Checker IG-320 manufactured by HORTBA, Ltd.) by a method conforming to the specular glossiness measurement method described in JIS Z8741-1997.

The reflected glare was measured by the following method.

A halogen lamp lighted inside a blackout curtain was visually observed at a normal line angle of 60 degrees with respect to a module glass surface, and whether or not a filament of the halogen lamp could be observed was determined.

As a result of these measurements, the results shown in Table 1 below were obtained.

TABLE 1

|  | Unit | Before surface treatment | After first blast processing step | After second blast processing step | After lamination of antireflection film |
|---|---|---|---|---|---|
| Glass surface-cracked area ratio | % | 0.0 | 27.2 | 4.4 | 2.2 |
| Short-circuit current value retention rate | % | 100.0 | 97.7 | 99.5 | 100.2 |
| Total reflectivity on incident surface side | % | 7.5 | 9.4 | 7.7 | 6.8 |
| Arithmatic mean roughness of surface | μm | 0.0 | 1.0 | 0.50 | 0.42 |
| Glossiness | — | 135.0 | 1.9 | 4.6 | 5.2 |
| Reflected Glare | — | Present | Absent | Absent | Absent |

The solar cell module of this example formed by carrying out the above-described steps was confirmed to have an improved power output (short-circuit current value retention rate) and an improved anti-glare property (reduced total reflectivity) as compared to a conventional solar cell module which was not subjected to the steps (solar cell module at the completion of the photoelectric conversion unit production step).

Figure 17:
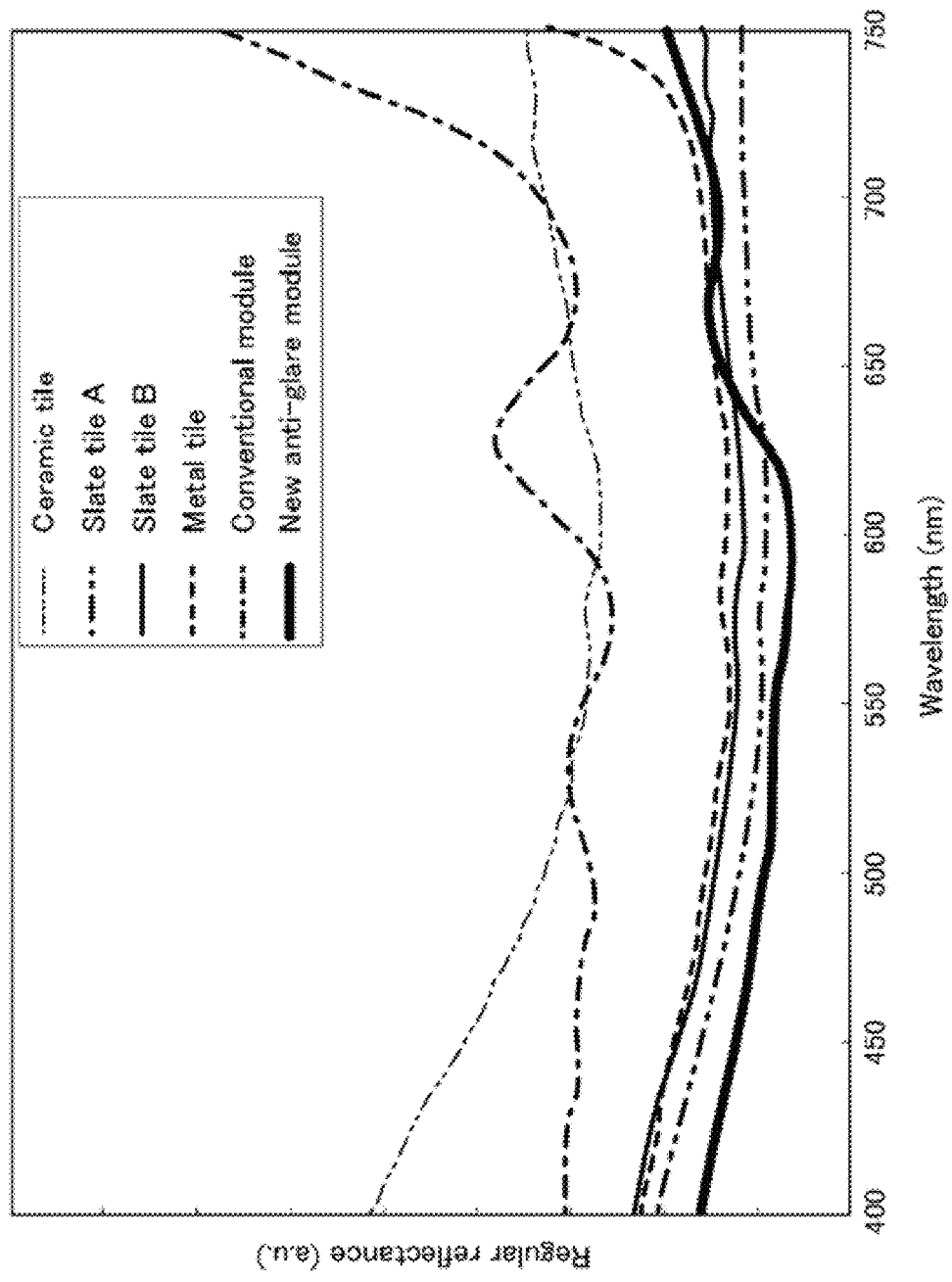
FIG. 17 is a graph showing the results of comparing the regular reflectance of the solar cell module according to Example 2 in the present invention with the regular reflectance of the solar cell module formed by the conventional technology and those commercially available roof materials.

Further, the solar cell module of this example was compared with the solar cell module produced by the conventional technology and various kinds of roof materials for the regular reflectance at an incidence angle of 8 degrees. The results thereof are shown in FIG. 17.

The roof materials used for comparison are four different roof materials including a ceramic tile, two different slate tiles (slate tile A and slate tile B), and a metal tile. In the graph of FIG. 17, the horizontal axis shows the wavelength of light applied to the object, and the vertical axis shows the regular reflectance.

As a result, the solar cell module of this example is confirmed to have a reduced regular reflectance as compared to the solar cell module produced by the conventional technology.

Further, the solar cell module of this example was relatively compared with the solar cell module produced by the conventional technology and various kinds of roof materials for the reflectance at an incidence angle of 60 degrees. As a result, the results shown in Table 2 below were obtained. Each value shown in Table 2 is a ratio of the reflectance where the reflectance of the ceramic tile is 1.

TABLE 2

| Solar cell module (second example) | Solar cell module (conventional technology) | Metal tile | Ceramic tile | Slate tile A | Slate tile B |
|---|---|---|---|---|---|
| 0.34 | 16.94 | 0.23 | 1.00 | 0.25 | 0.68 |

As a result, the solar cell module of this example is confirmed to have a reduced reflectance at an incidence angle of 60 degrees as compared to the solar cell module produced by the conventional technology.

The antireflection film laminated on the solar cell module of this example was compared with the antireflection film of the solar cell module produced by the conventional technology for viscosity before curing. A comparison was made on the viscosity of the antireflection film (substance for forming the antireflection film) immediately after it was applied on the glass substrate. As a result, the results shown in Table 3 below were obtained. In Table 3, the viscosity of pure water is also described as reference.

TABLE 3

| Liquid | Viscosity (mPa · s) |
|---|---|
| Pure water | 0.92 |
| Antireflection film (Present application) | 0.98 |
| Antireflection film (Conventional Technology) | 2.83 |

It is confirmed that in the solar cell module of this example, the viscosity before curing is extremely lower as compared to the conventional technology, and is very close to that of pure water. In this example, the viscosity of the antireflection film before curing is reduced, so that the antireflection film sufficiently penetrates into cracks formed on the glass substrate.

Figure 18A:
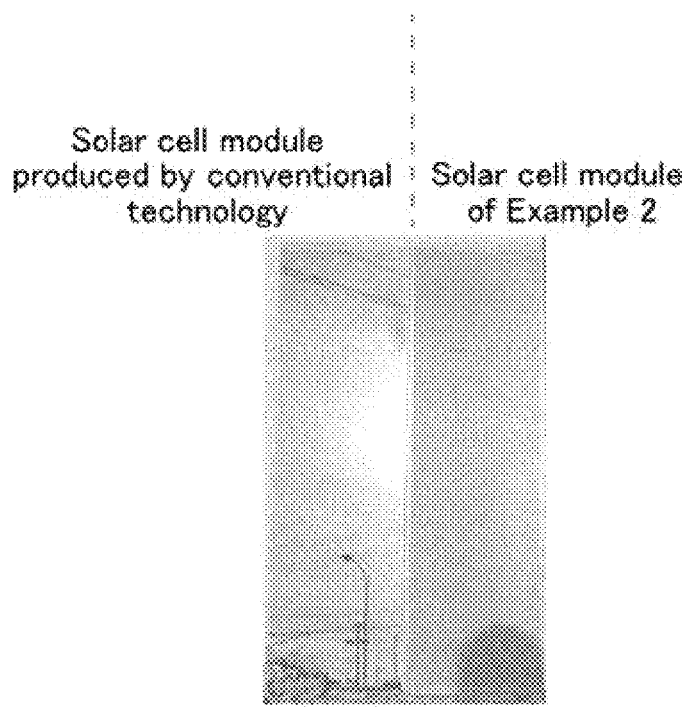
FIGS. 18A and 18B are reference photographs obtained by photographing in daytime natural light a solar cell module according to Example 2 in the present invention and the solar cell module formed by the conventional technology, with the photographs 18A and 18B taken at different locations.
Figure 18B:
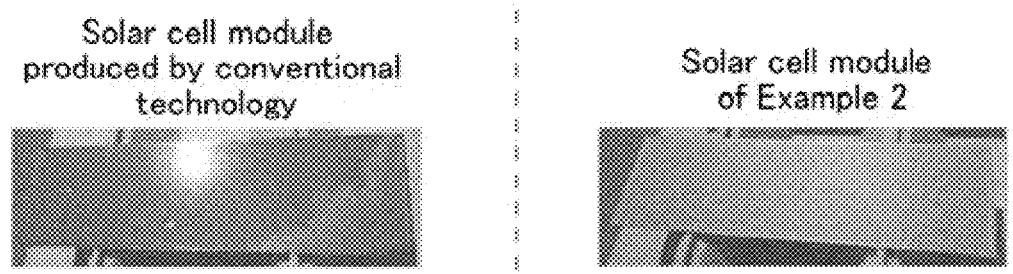

The solar cell module of this example and the solar cell module produced by the conventional technology were each photographed in the state of being irradiated with the same light, and a glare felt by a person was examined. As a result, as shown in FIGS. 18A and 18B, the solar cell module produced by the conventional technology was confirmed to appear to be shining more intensely than the solar cell module of this example. That is, it is confirmed that the solar cell module of this example does not easily cause a person to feel a glare in a state of being irradiated with light, and thus has a high anti-glare property.

Further, as shown in the cross-section-enlarged photographs (scanning electron microscope images: SEM images) in FIGS. 13A to 16B, the antireflection film penetrates into depressions formed through the second roughening step, so that the surface of the solar cell module becomes smooth.

That is, when the antireflection film is laminated, the antireflection film is thickly laminated at portions of the glass substrate which have deep depressions, and the antireflection film is thinly laminated at portions of the glass substrate which have shallow depressions. Therefore, the glass substrate itself has irregularities, but the surface of the antireflection film laminated on the glass substrate is smoothed. The antireflection film covers angular portions of the surface of the glass substrate.

In this example, a surface (light-incident surface) of the solar cell module is smoothed to provide a structure in which stains are not easily deposited on the surface. That is, in the solar cell module of the second example, not only the anti-glare property but also the antifouling property is improved.

The solar cell module of this example and a solar cell module produced by a conventional technology were each scattered with sand when laid down on the ground sideways. Thereafter, one side of each of the solar cell modules was lifted, and the solar cell module was erected in the state of being inclined at an angle of 45 degrees with respect to the ground surface.

As a result, in the solar cell module of this example, sand was removed from areas constituting 90 percent of the whole region scattered with sand when the solar cell module was inclined at an angle of 45 degrees as shown in FIG. 19A. On the other hand, in the solar cell module produced by the conventional technology, almost no sand was removed. That is, the solar cell module of this example is shown to have a structure in which stains are not easily deposited.

Using a pencil and an oil-based marker, stains were deposited on the solar cell module of this example and the solar cell module produced by the conventional technology. The solar cell modules were each wiped with a damp cloth five times, and a comparison is made on how the stains were removed.

As a result, as shown in FIG. 19B, it was confirmed that in the solar cell module of this example, stains were more easily removed as compared to the solar cell module produced by the conventional technology. That is, the solar cell module of this example was confirmed to have a high antifouling property.

Figure 20A:
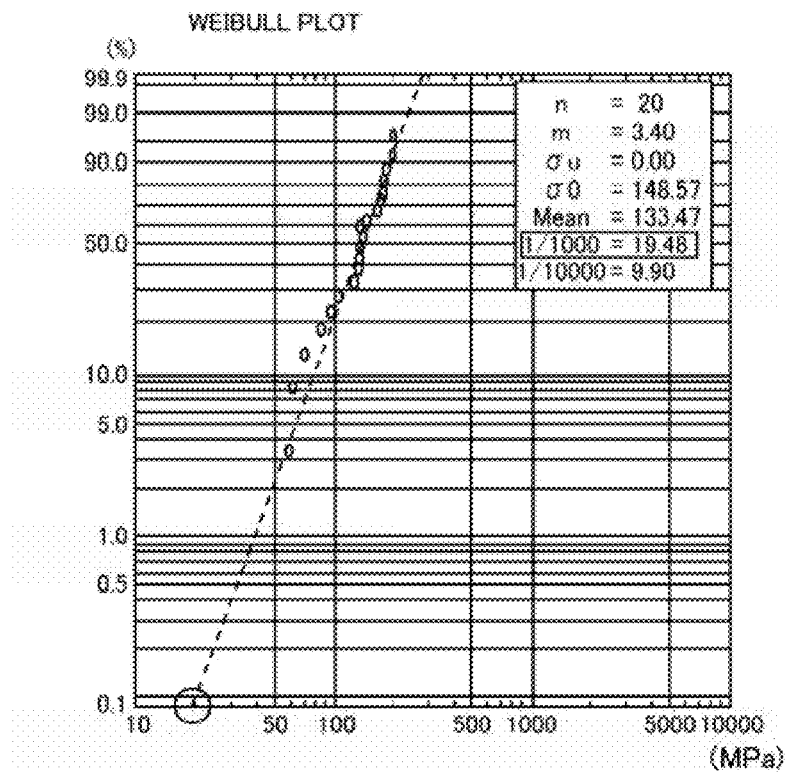
FIGS. 20A and 20B are graphs showing the results of measuring the strength of an anti-glare glass plate subjected to steps according to Example 2 in the present invention and that of a usual glass plate, where FIG. 20A corresponds to a usual glass plate.

Subsequently, a ring bending test was conducted for each of a glass plate subjected to the first roughening step, the second roughening step, and the antireflection film forming step; and a usual glass plate that had not been subjected to these steps. After that, a comparison was made on the strengths thereof. Results of measurements in the ring bending test, which are represented in the form of the Weibull plot, are shown in FIGS. 20A and 20B.

Figure 20B:
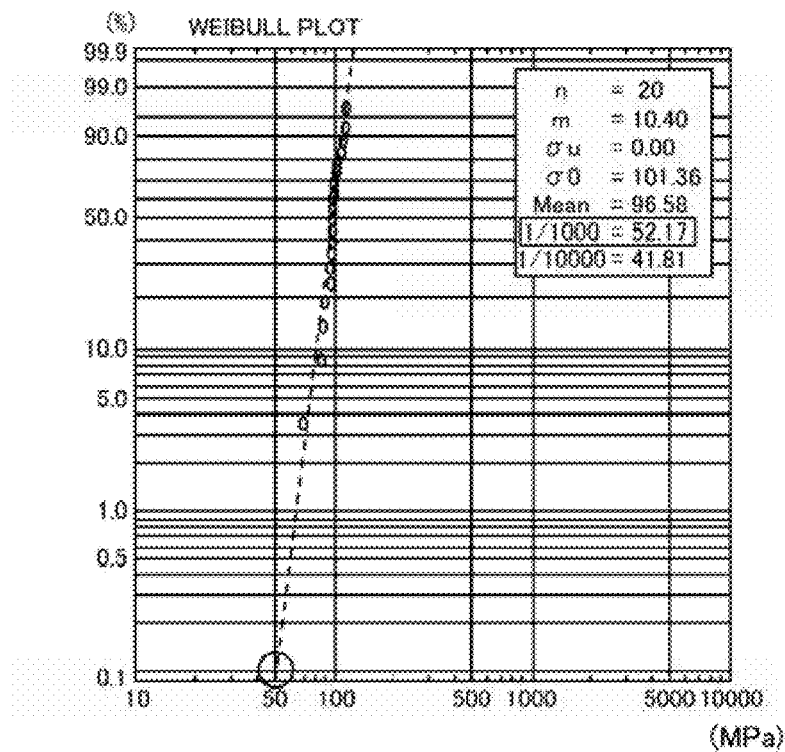
Figure 21A:
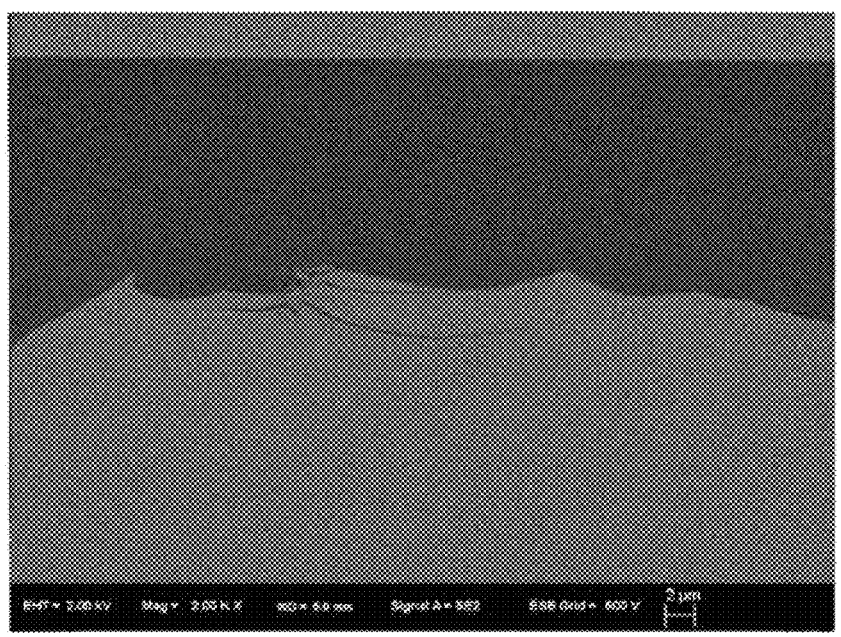
FIGS. 21A and 21B are views showing the vicinity of a light-incident surface of a solar cell module according to Comparative Example 1, where FIG. 21A s a photograph showing an SEM image.
Figure 21B:
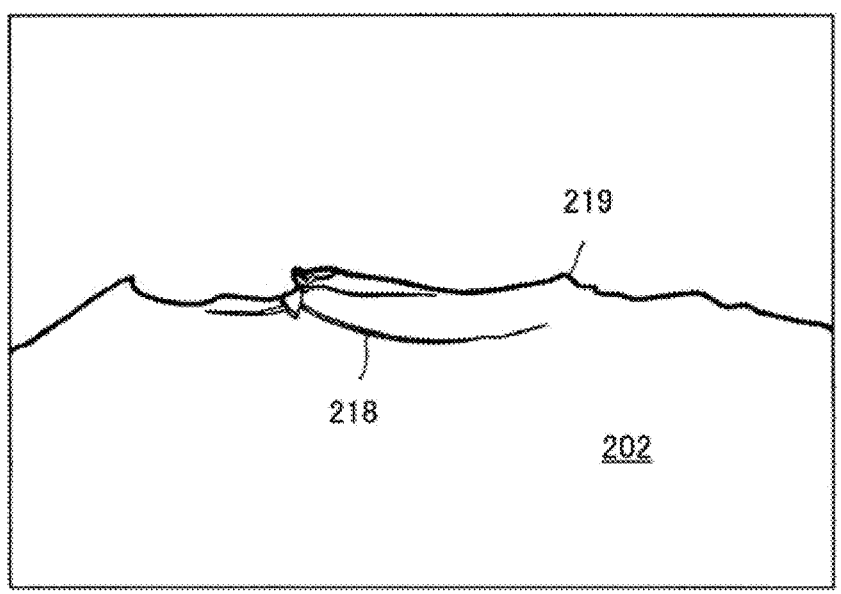
Figure 22A:
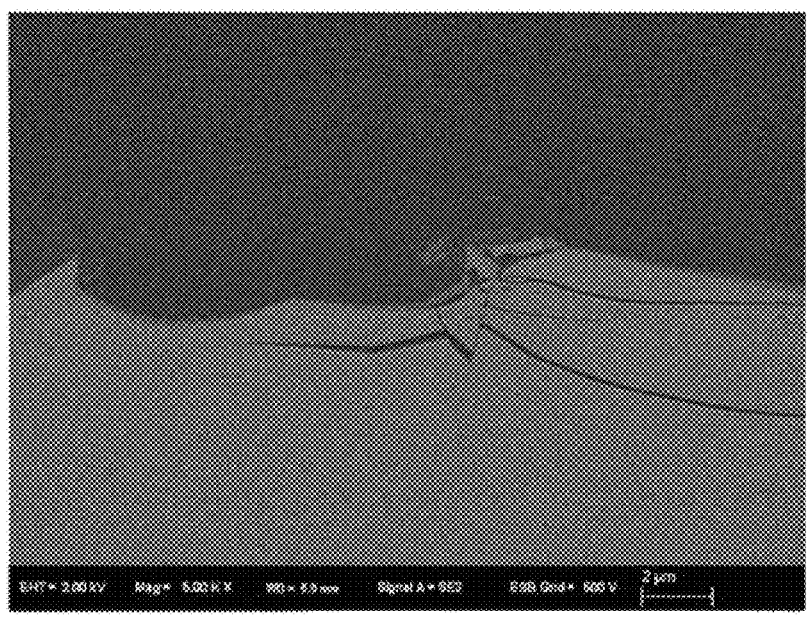
FIGS. 22A and 22B are views showing a part of FIGS. 21A and 21B in an enlarged form, where
Figure 22B:
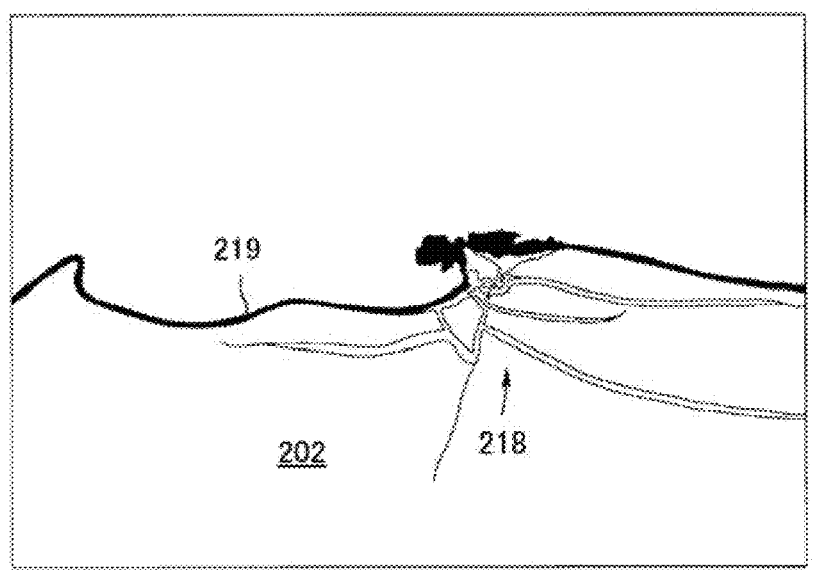

As a result, the pressure at which the usual glass plate was broken with a probability of 0.1 percent was about 20 MPa (see FIG. 20A), whereas the pressure at which the glass plate subjected to the first roughening step, the second roughening step, and the antireflection film forming step was broken with a probability of 0.1 percent was about 50 MPa (see FIG. 20B).

That is, the solar cell module of this example is shown to exhibit a high strength. The reason why the glass plate of this example has a greater strength than that of the usual glass may be that the distortion of the glass plate itself is relaxed through the first roughening step and the second roughening step.

Comparative Example 1

A solar cell module was produced by the method described in Patent Document 3, and a cross-section-enlarged photograph (scanning electron microscope image: SEM image) was taken. The cross-section-enlarged photographs are shown in FIGS. 21A to 25B. Cross-section-enlarged photographs (SEM images) as shown in FIGS. 21A to 25B can be obtained with a magnification of several hundred times to several thousand times.

As a result, an antireflection film 219 was laminated on a surface of a glass substrate 202, but substantially all cracks 218 were hollow. That is, it is shown that as described above, a gap is formed in the crack 218, and light is reflected at the inner surface of the crack 218.

Figure 23A:
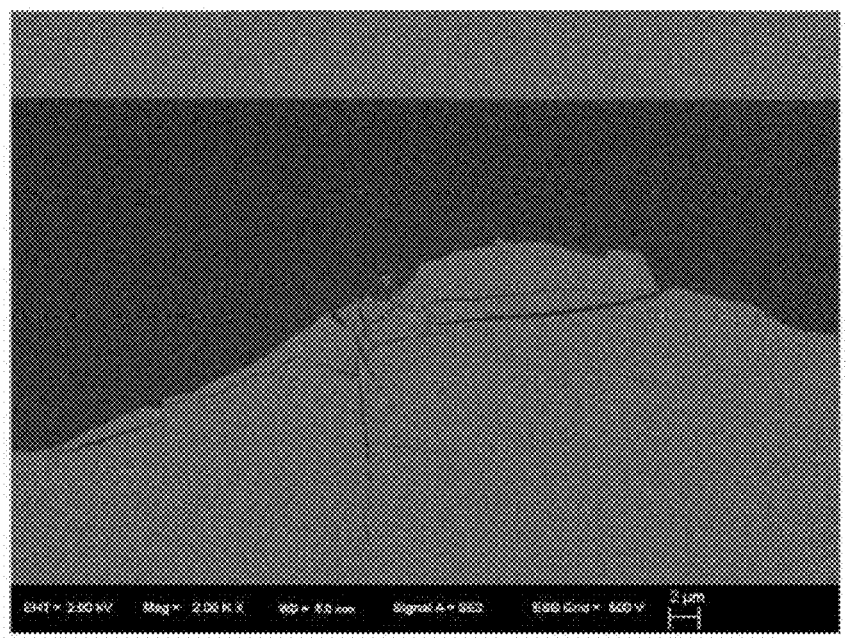
FIGS. 23A and 23B are views showing the vicinity of the light-incident surface of the solar cell module according to Comparative Example 1, and showing a portion different from that in FIGS. 21A and 21B, where
Figure 23B:
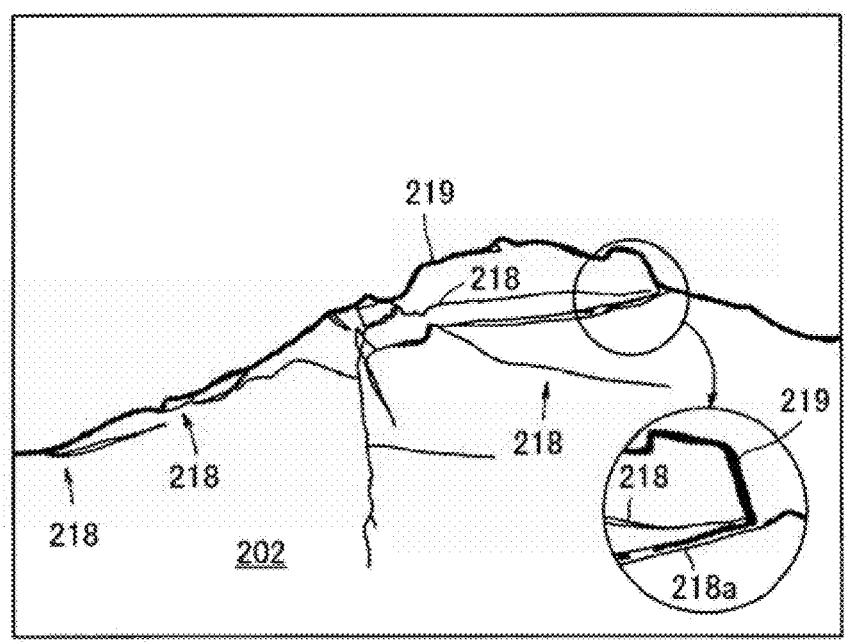
Figure 24A:
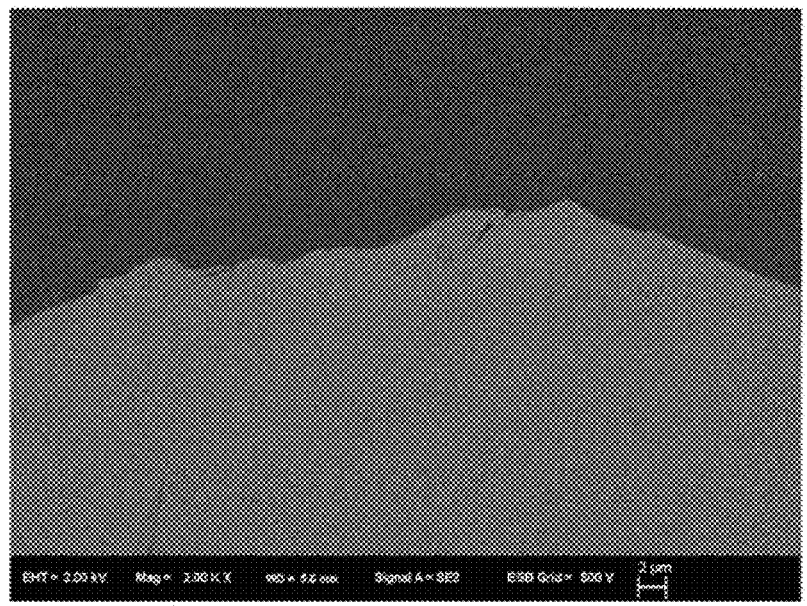
FIGS. 24A and 24B are views showing the vicinity of the light-incident surface of the solar cell module according to Comparative Example 1, and showing a portion different from those in FIGS. 21A, 21B, end 23A and 23B, where
Figure 24B:
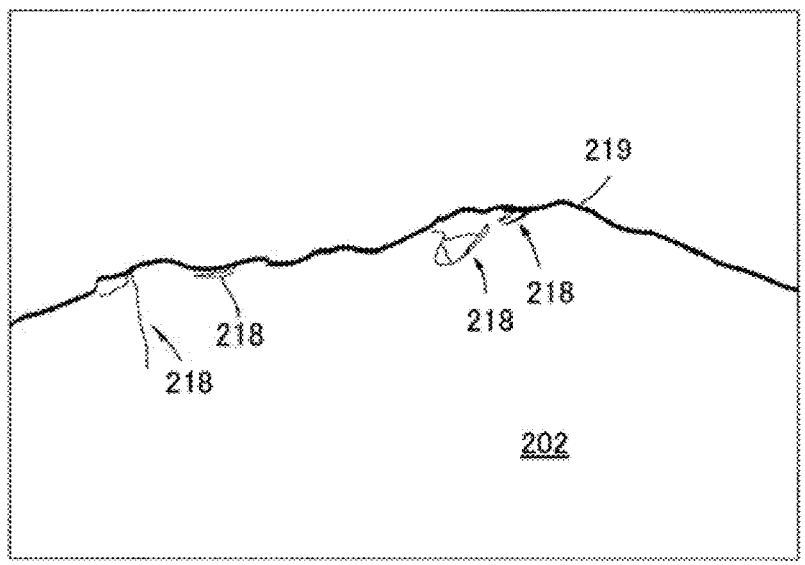
Figure 25A:
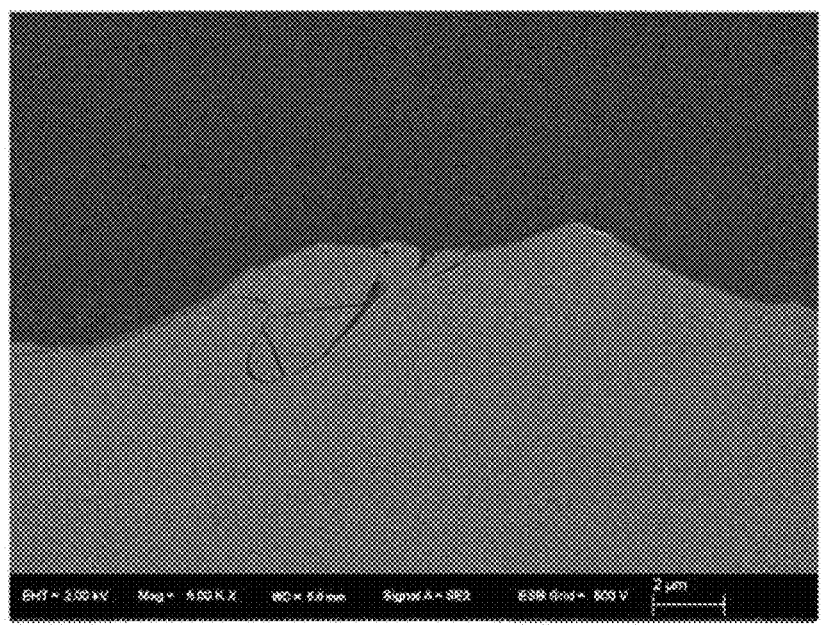
FIGS. 25A and 25B are views showing a part of FIGS. 24A and 24 in an enlarged form, where
Figure 25B:
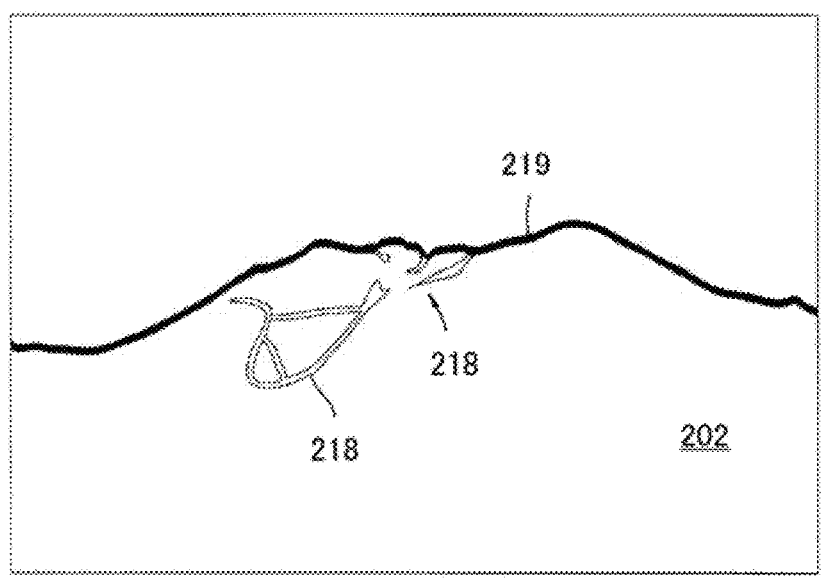
Figure 26A:
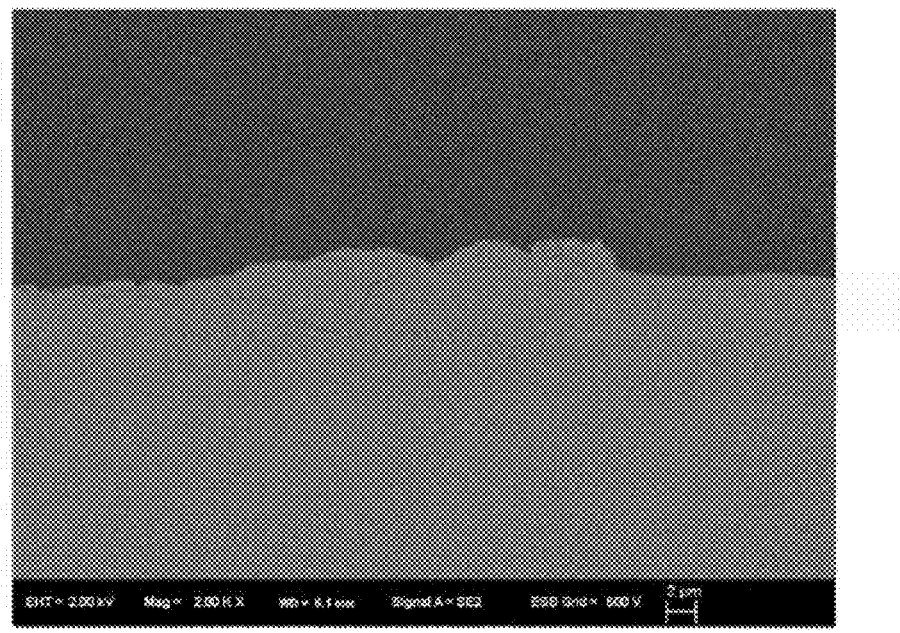
FIGS. 26A and 26B a are views showing the vicinity of a light-incident surface of a solar cell module according to Comparative Example 2, where
Figure 26B:
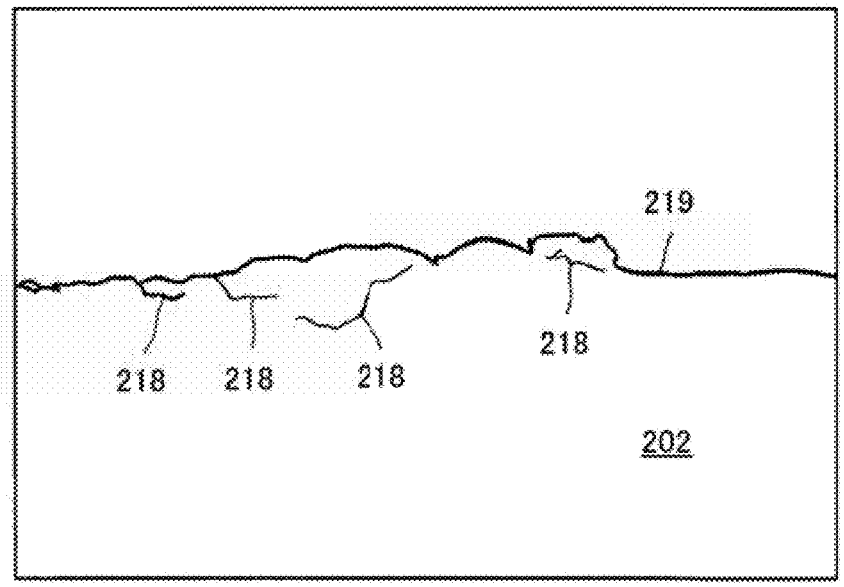
Figure 27A:
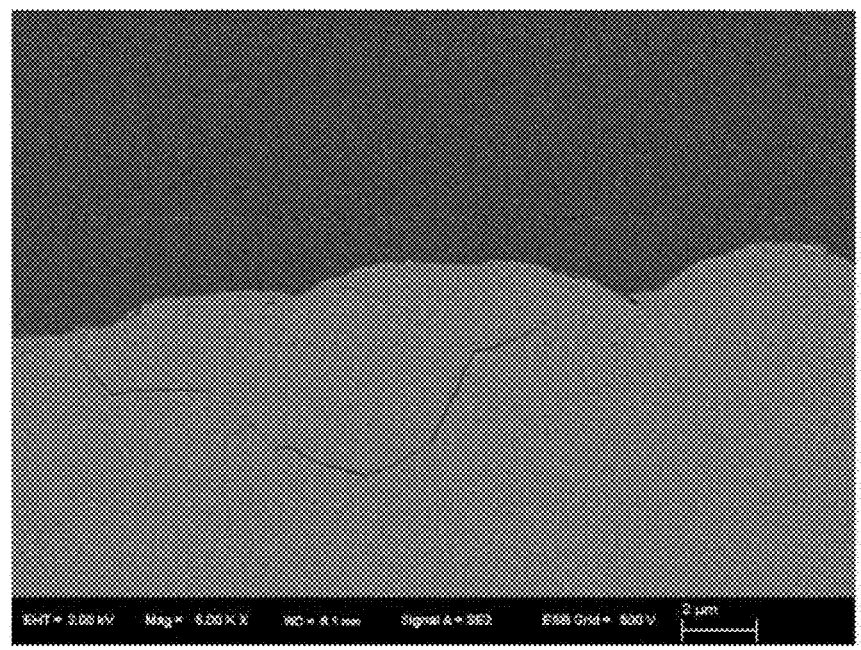
FIGS. 27A and 27B are views showing a part of FIGS. 26A and 26B in an enlarged form, where
Figure 27B:
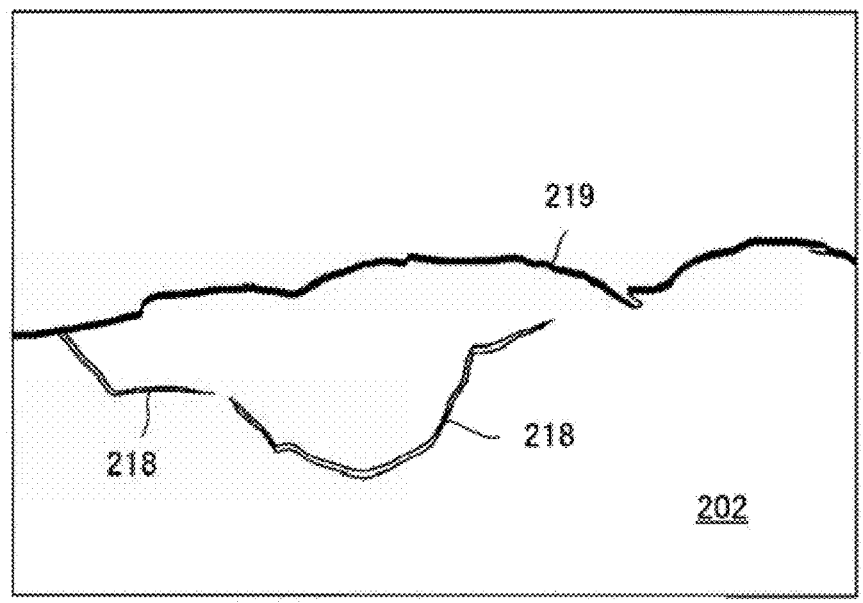
Figure 28A:
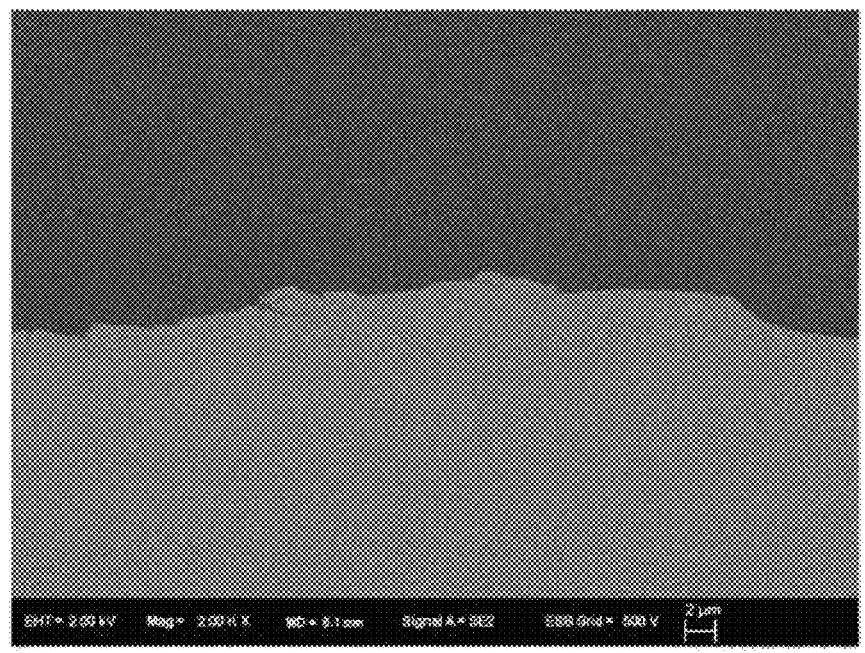
FIGS. 28A and 28B are views showing the vicinity of the light-incident surface of the solar cell module according to Comparative Example 2, and showing a portion different from that in FIGS. 26A and 26B, where
Figure 28B:
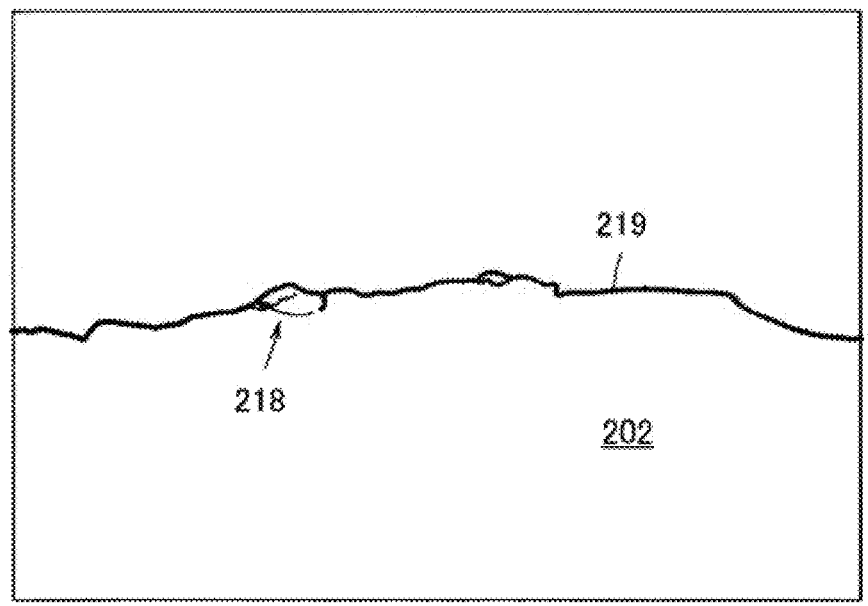
Figure 29A:
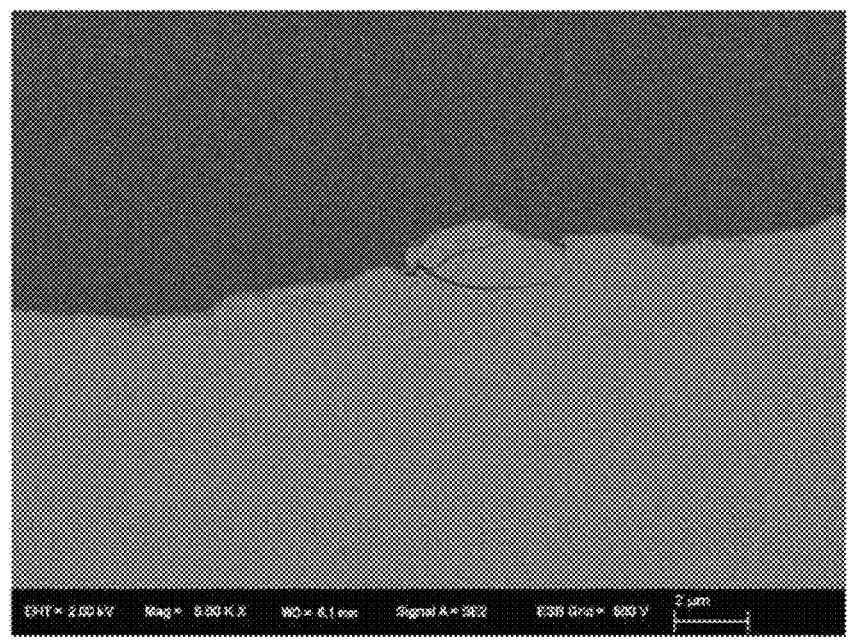
FIGS. 29A and 29B are views showing a part of FIGS. 28A and 28B in an enlarged form, where
Figure 29B:
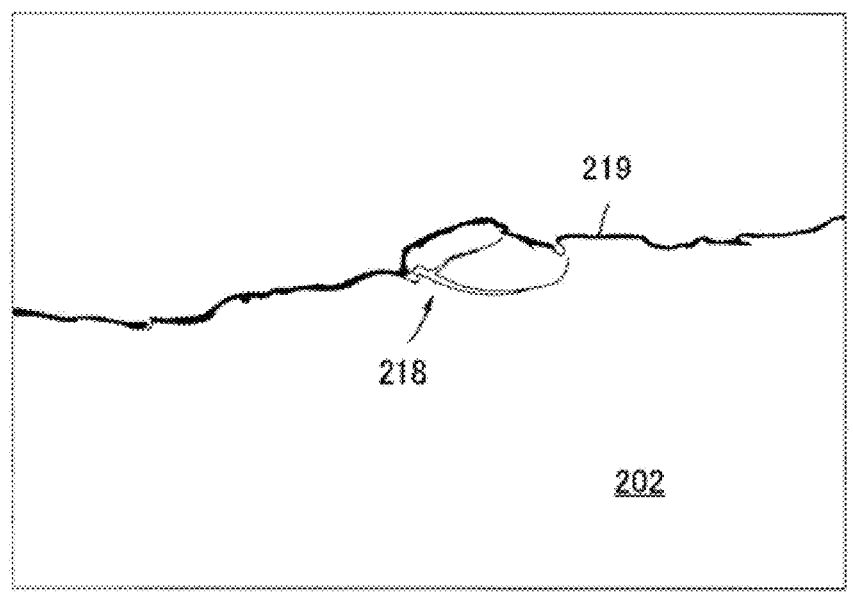
Figure 30A:
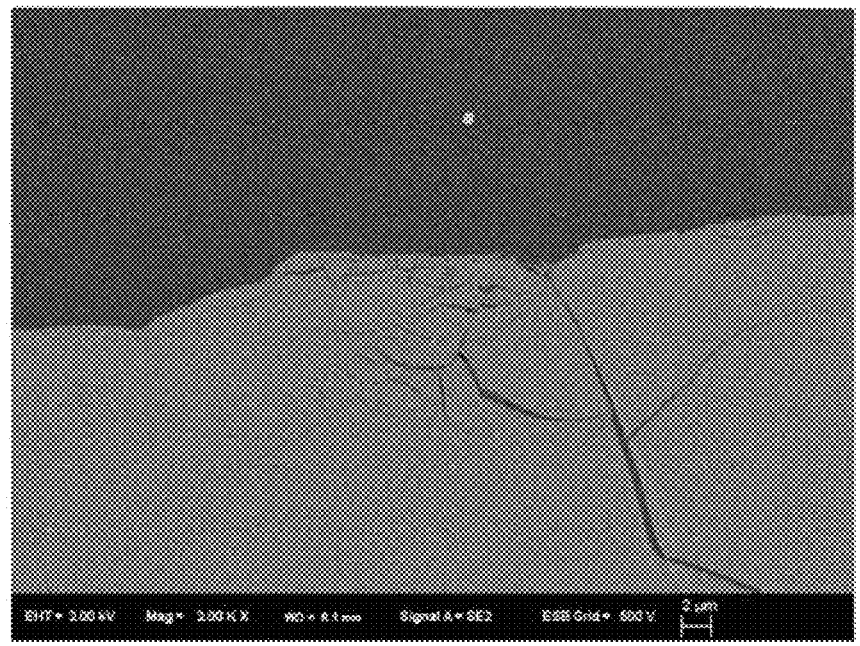
FIGS. 30A and 30B are views showing the vicinity of the light-incident surface of the solar cell module according to Comparative Example 2, and showing a portion different from those in FIGS. 26A 26B, 28A and 28B, where
Figure 30B:
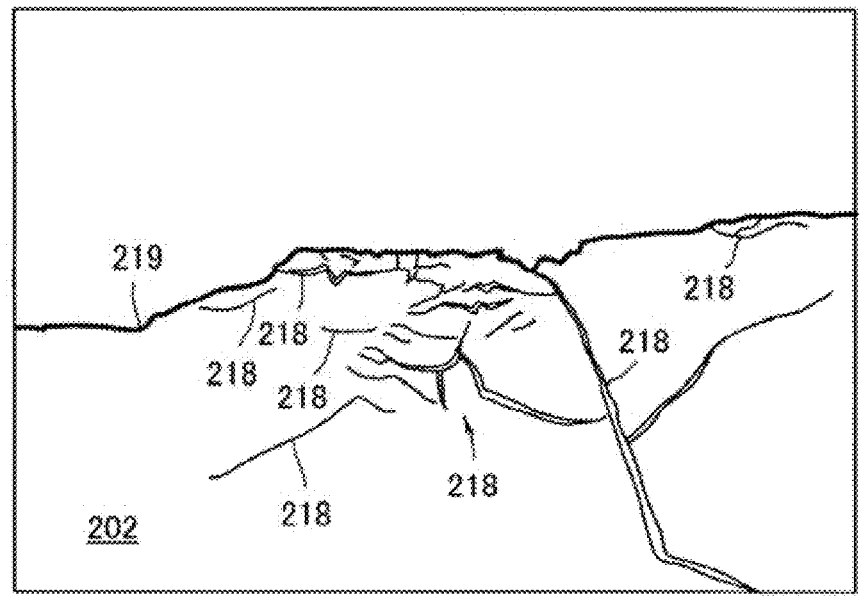
Figure 31A:
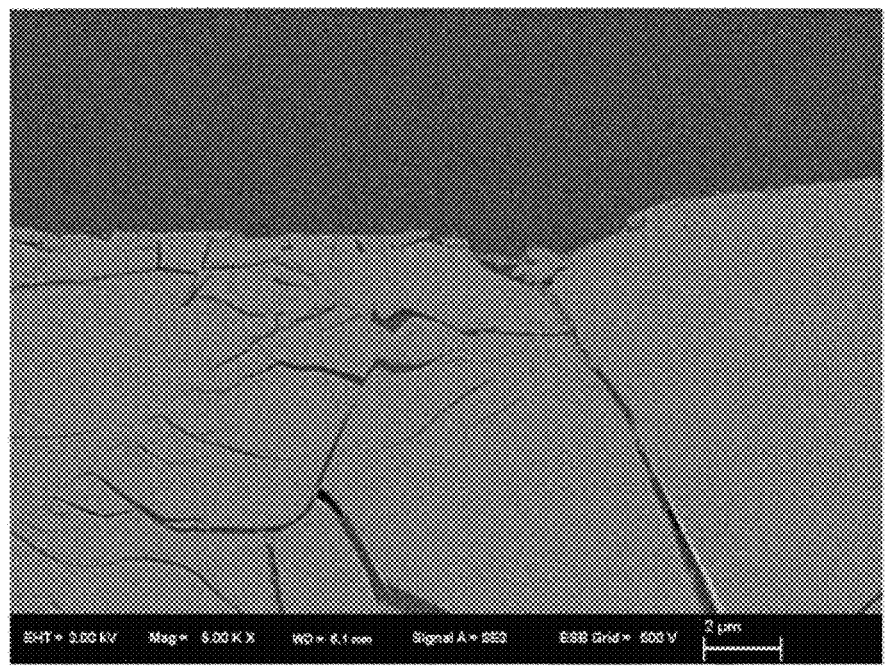
FIGS. 31A and 31B are views showing a part of FIGS. 30A and 30B in an enlarged form, where
Figure 31B:
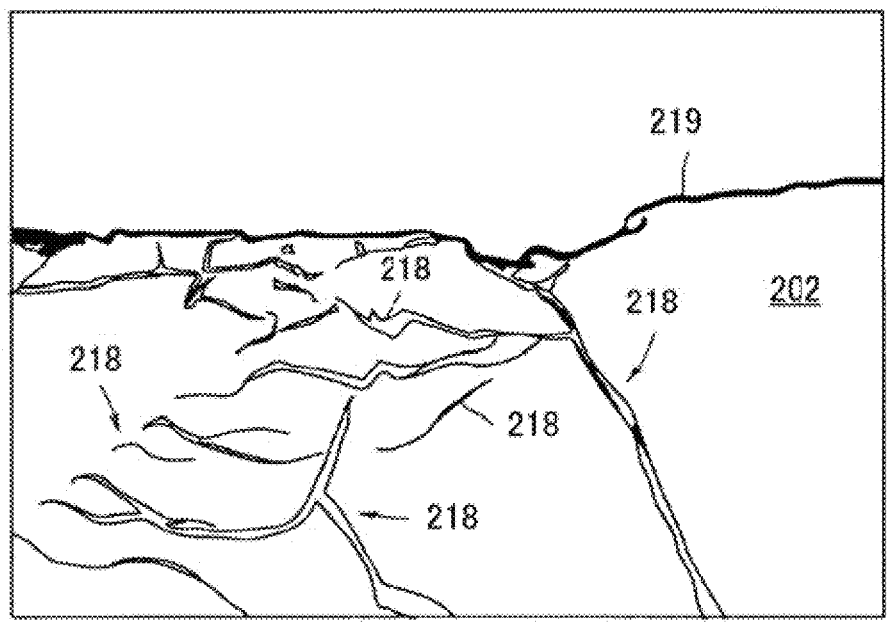

Here, when attention is paid to FIGS. 23A and 23B, a substance for forming the antireflection film 219 slightly penetrates into the crack 218a shown in FIGS. 23A and 23B. However, this substance slightly sticks only to the upper surface (surface situated at the outside) of the crack 218a, and a space is formed in the vicinity of the lower surface (surface situated at the inside) of the crack 218a. Therefore, light is reflected at the inner surface of the crack 218a.

Specifically, first in the solar cell modules of the above-described examples (see FIGS. 77 to 10B and 13A to 16B), the space extending from the upper surface to the lower surface of the crack 18 is filled with the substance for forming the antireflection film 19 when attention is paid to a portion of the internal space of the crack 18 in which the antireflection film 19 exists. That is, at a portion of the crack 18 in which the antireflection film 19 exists, the antireflection film 19 extends over the whole region in the thickness direction of the glass substrate 2. In other words, the portion is completely filled with the antireflection film 19 in the thickness direction of the glass substrate 2. Accordingly, at least a portion of the inside of the crack 18 is completely packed with the substance for forming the antireflection film 19, and this portion is filled with the antireflection film 19. Therefore, in the solar cell module 1 of the above-described example, light is not highly reflected at a portion in which the crack 18 is formed as described above.

On the other hand, in the crack 218a shown in FIGS. 23A and 23B the substance for forming the antireflection film 219 is deposited only on the upper surface of the crack 218a, and a large gap is formed in the vicinity of the lower surface of the crack 218a. That is, in the solar cell module produced by the conventional technology, there is a case where a large crack 218a is formed, and the antireflection film 219 happens to penetrate into the crack 218a. However, the substance (substance for forming the antireflection film 219) does not penetrate in an amount sufficient to fill the whole region of the internal space of the crack 218a in the thickness direction of the glass substrate 202. That is, at every portion of cracks 218, a gap is formed in the vicinity of the upper surface (in the vicinity of the surface situated at the outside) or in the vicinity of the lower surface (in the vicinity of the surface situated at the inside). Accordingly, effects like those of the invention of the present application are not exhibited, and light is reflected at a portion in which the crack 218a is formed.

Comparative Example 2

A solar cell module 1 of the second comparative example was produced by the method described in Patent Document 3 similarly to Comparative Example 1, but blast processing was performed over a plurality of times.

That is, a solar cell module was produced by a production method in which only the number of times of blast processing was increased as compared to the production method of the conventional technology.

A cross-section-enlarged photograph (scanning electron microscope image: SEM image) of a glass substrate of the produced solar cell module was taken. The cross-section-enlarged photograph is shown in FIGS. 26A to 31B. Cross-section-enlarged photographs (SEM images) as shown in FIGS. 26A to 31B can be obtained with a magnification of several hundred times to several thousand times.

As a result, an antireflection film 219 was laminated on a surface of the glass substrate 202, but substantially all cracks 218 were hollow. The substance for forming the antireflection film 219 slightly penetrated into some cracks 218, but in none of the cracks 218 did the substance (substance for forming the antireflection film 219) penetrate in an amount sufficient to close the whole region of the space, which was formed in the crack 218, in the thickness direction of the glass substrate 202. That is, it is shown that as described above, a gap is formed in the crack 218, and light is reflected at the inner surface of the crack 218. That is, it has been shown that the production method in which only the number of times of blast processing is increased does not ensure that the antireflection film 19 penetrates into the crack 18 like the invention of the present application.

Further, microscope photographs of the surface of the solar cell module of Example 2 and the surface of the solar cell module of this comparative example (Comparative Example 2) were taken.

Figure 32:
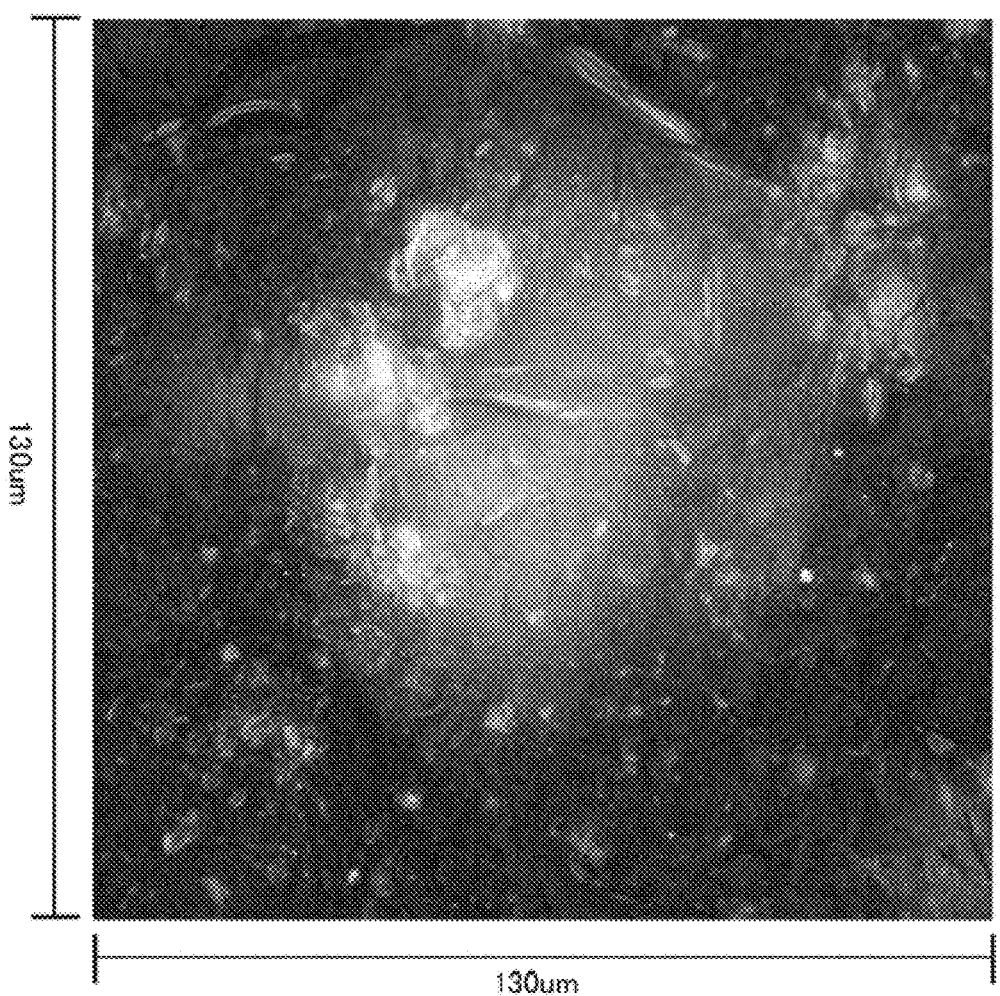
FIG. 32 is an optical image showing a surface of a glass substrate of the solar cell module according to Comparative Example 2.

FIG. 32 is a microscope photograph (optical image) showing the surface of the glass substrate 202 of this comparative example, where the portion appearing white is a lateral crack.

Figure 33:
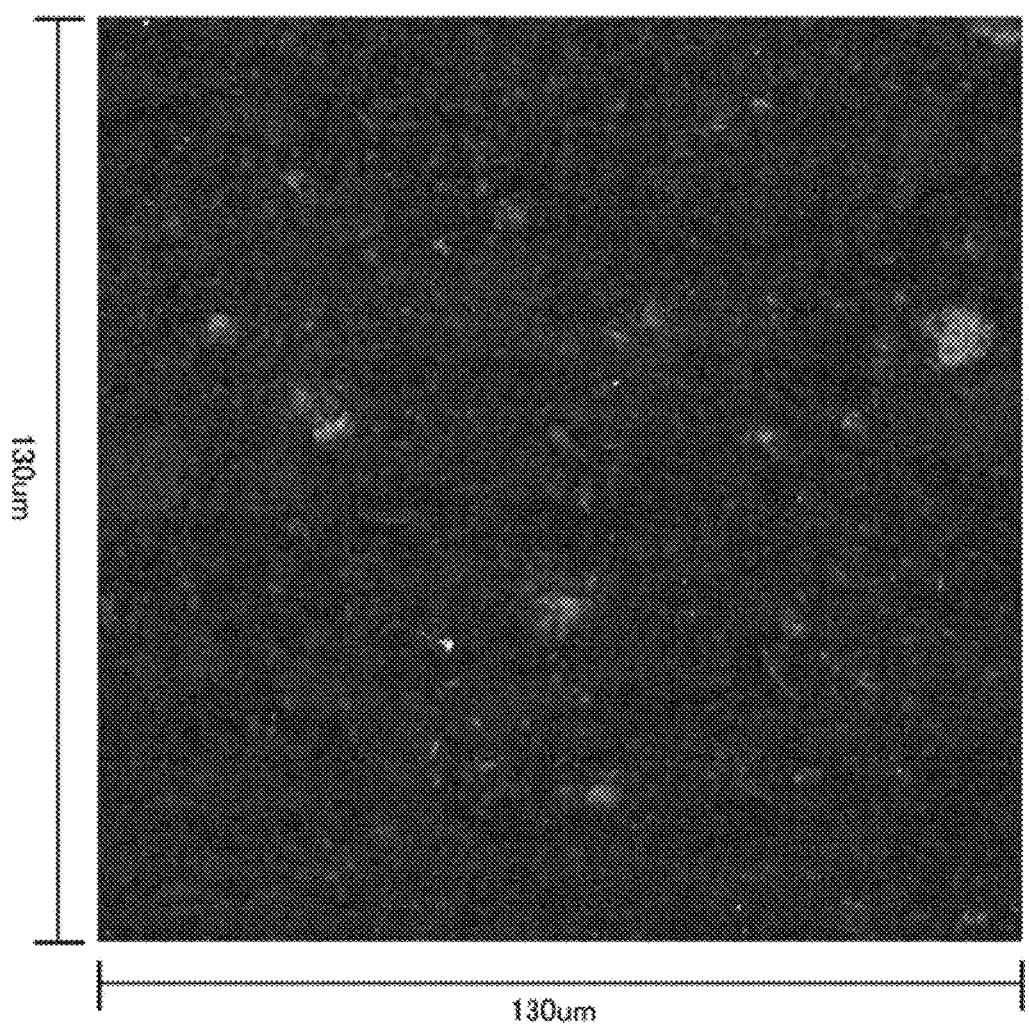
FIG. 33 is an optical image showing a surface of a glass substrate of the solar cell module according to Example 2 in the present invention.
Figure 34A:
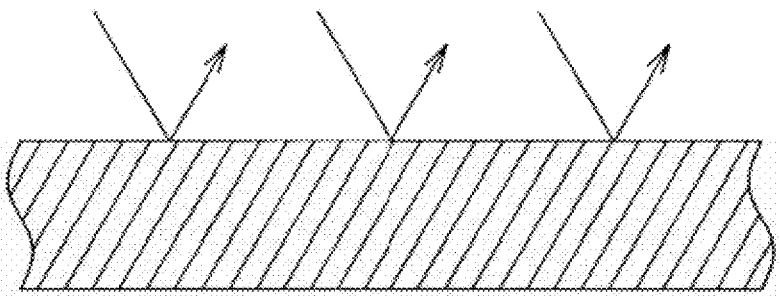
FIGS. 34A to 34C are explanatory views conceptually showing the vicinity of a light-incident surface of a solar cell module formed by a conventional technology, where
Figure 34B:
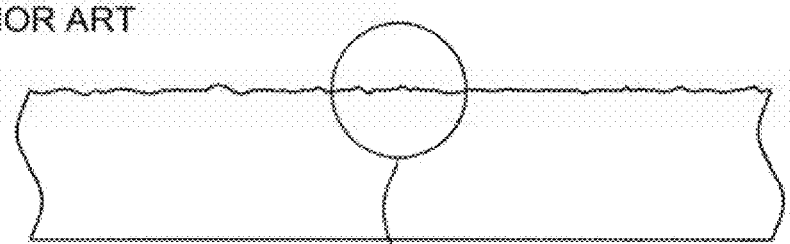
Figure 34C:
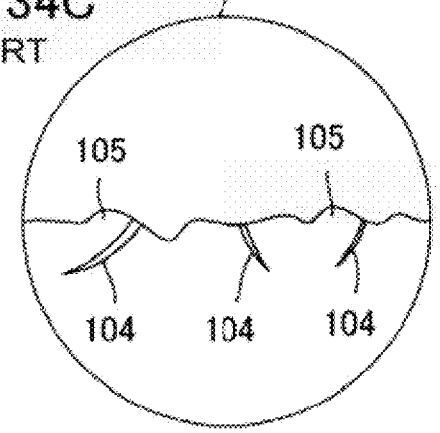

FIG. 33 is a microscope photograph (optical image) showing the surface of the glass substrate 2 of Example 2, where the portion appearing white is a portion of the lateral crack in which the antireflection film does not exist.

In the solar cell module of the present invention (FIG. 33), reflection of incident light in the crack is reduced (the portion shining white is smaller) as compared to the solar cell module produced by the conventional technology (FIG. 32).

LIST OF REFERENCE CHARACTERS

1 Solar cell module
2 Glass substrate (plate body)
18 Crack
19 Antireflection film

The invention claimed is:

1. A solar cell module comprising:
a plate body made of glass and having a macroscopically flat surface; and
a photoelectric conversion unit,
wherein the solar cell module generates electricity in the photoelectric conversion unit by making light incident from the plate body to the photoelectric conversion unit,
wherein the surface of the plate body is microscopically roughened to include a large number of irregularly shaped lateral cracks extending for a distance in two in-plane orthogonal directions parallel to the macroscopically flat surface of the plate body as observed macroscopically,
wherein an antireflection film is laminated on the surface of the plate body, and a part of a substance for forming the antireflection film penetrates into the lateral cracks,
wherein at least one of the lateral cracks has a space thereof that is filled with the substance over a whole region in a thickness direction of the plate body, and wherein a portion in which the substance for forming the antireflection film penetrates into one of the lateral cracks over 3 micrometers or more exists on at least a part of the plate body when a cross-section cutting through the plate body in the thickness direction is observed.

2. The solar cell module according to claim 1, wherein at least a part of the plate body has a region where a plurality of the lateral cracks exist in a 60-micrometer-long range along the macroscopically flat surface, and a total size of components parallel to the macroscopically flat surface of the plurality of the lateral cracks is 8 micrometers or more.

3. The solar cell module according to claim 1, wherein a refractive index of the antireflection film to light having a wavelength of 600 nm is 1.35 to 1.60.

4. The solar cell module according to claim 1, wherein the antireflection film is formed of a substance containing fine particles composed of titanium oxide and silicon oxide.

5. The solar cell module according to claim 1, wherein an arithmetic mean deviation of a light-incident surface of the solar cell module is 0.4 to 2.0 micrometers.

6. A solar cell module comprising:
a plate body made of glass and having a macroscopically flat surface; and
a photoelectric conversion unit,
wherein the solar cell module generates electricity in the photoelectric conversion unit by making light incident from the plate body to the photoelectric conversion unit,
wherein the surface of the plate body is microscopically roughened to include a large number of irregularly shaped lateral cracks extending for a distance in two in-plane orthogonal directions parallel to the macroscopically flat surface of the plate body as observed macroscopically,
wherein an antireflection film is laminated on the surface of the plate body, and a part of a substance for forming the antireflection film penetrates into the lateral cracks,
wherein at least one of the lateral cracks has a space thereof that is filled with the substance over a whole region in a thickness direction of the plate body, and
wherein at least a part of the plate body has a region where 10 or more of the lateral cracks each having a maximum component parallel to the macroscopically flat surface of 4 micrometers or more exist per $1.69 \times 10^4$ square micrometers when the plate body is planarly observed.

7. A solar cell module comprising:
a plate body made of glass and having a macroscopically flat surface; and
a photoelectric conversion unit,
wherein the solar cell module generates electricity in the photoelectric conversion unit by making light incident from the plate body to the photoelectric conversion unit,
wherein the surface of the plate body is microscopically roughened to include a large number of irregularly shaped lateral cracks extending for a distance in two in-plane orthogonal directions parallel to the macroscopically flat surface of the plate body as observed macroscopically,
wherein an antireflection film is laminated on the surface of the plate body, and a part of a substance for forming the antireflection film penetrates into the lateral cracks,
wherein at least one of the lateral cracks has a space thereof that is filled with the substance over a whole region in a thickness direction of the plate body, and
wherein at least a part of the plate body has a region where 15 or more of the lateral cracks each having a maximum component parallel to the macroscopically flat surface of 6 micrometers or more exist per $1.69 \times 10^4$ square micrometers when the plate body is planarly observed.

* * * * *